(12) United States Patent
Sokol et al.

(10) Patent No.: US 11,393,948 B2
(45) Date of Patent: Jul. 19, 2022

(54) GROUP III NITRIDE LED STRUCTURES WITH IMPROVED ELECTRICAL PERFORMANCE

(71) Applicant: CreeLED, Inc., Durham, NC (US)

(72) Inventors: Joseph G. Sokol, Durham, NC (US); Jefferson W. Plummer, Durham, NC (US); Caleb A. Kent, Durham, NC (US); Thomas A. Kuhr, Durham, NC (US); Robert David Schmidt, Wake Forest, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/118,788

(22) Filed: Aug. 31, 2018

(65) Prior Publication Data

US 2020/0075798 A1 Mar. 5, 2020

(51) Int. Cl.
*H01L 33/06* (2010.01)
*H01L 33/00* (2010.01)
*H01L 33/32* (2010.01)

(52) U.S. Cl.
CPC .......... *H01L 33/06* (2013.01); *H01L 33/0025* (2013.01); *H01L 33/32* (2013.01)

(58) Field of Classification Search
CPC ..... H01L 33/06; H01L 33/0025; H01L 33/32; H01L 21/02507; H01L 31/035236;
(Continued)

(56) References Cited

U.S. PATENT DOCUMENTS

| 5,393,993 A | 2/1995 | Edmond et al. |
| 5,523,589 A | 6/1996 | Edmond et al. |

(Continued)

FOREIGN PATENT DOCUMENTS

| JP | 2001007379 A | 1/2001 |
| JP | 4899632 B2 | 3/2012 |
| WO | 2013128894 A1 | 9/2013 |

OTHER PUBLICATIONS

Non-Final Office Action for U.S. Appl. No. 16/267,636, dated Dec. 13, 2019, 14 pages.
(Continued)

*Primary Examiner* — Eric K Ashbahian
(74) *Attorney, Agent, or Firm* — Withrow & Terranova, P.L.L.C

(57) ABSTRACT

Group III nitride light emitting diode (LED) structures with improved electrical performance are disclosed. A Group III nitride LED structure includes one or more n-type layers, one or more p-type layers, and an active region that includes a plurality of sequentially arranged barrier-well units. In certain embodiments, doping profiles of barrier layers of the barrier-well units are configured such that a doping concentration in some barrier-well units is different than a doping concentration in other barrier-well units. In certain embodiments, a doping profile of a particular barrier layer is non-uniform. In addition to active region configurations, the doping profiles and sequence of the n-type layers and p-type layers are configured to provide Group III nitride structures with higher efficiency, lower forward voltages, and improved forward voltage performance at elevated currents and temperatures.

16 Claims, 16 Drawing Sheets

(58) Field of Classification Search
CPC ....... H01L 33/00–06; H01L 33/26–325; H01S 5/3406; H01S 5/3072; H01S 5/309; H01S 5/34; H01S 5/3413; H01S 5/2018; H01S 5/18308

See application file for complete search history.

(56) References Cited

U.S. PATENT DOCUMENTS

| | | | |
|---|---|---|---|
| 6,201,262 | B1 | 3/2001 | Edmond et al. |
| 6,479,836 | B1 | 11/2002 | Suzuki et al. |
| 6,515,313 | B1 | 2/2003 | Ibbetson et al. |
| 6,998,284 | B2 | 2/2006 | Kyono et al. |
| 7,030,414 | B2 | 4/2006 | Asami et al. |
| 7,034,328 | B2 | 4/2006 | Doverspike et al. |
| 7,611,917 | B2 | 11/2009 | Emerson et al. |
| 7,692,182 | B2 | 4/2010 | Bergmann et al. |
| 7,692,209 | B2 | 4/2010 | Edmond et al. |
| RE42,007 | E | 12/2010 | Doverspike et al. |
| 8,000,366 | B2 | 8/2011 | Bour et al. |
| 8,247,792 | B2 | 8/2012 | Kim |
| 8,390,004 | B2 | 3/2013 | Avramescu et al. |
| 8,451,877 | B1* | 5/2013 | Crawford .............. H01S 5/3413 372/45.01 |
| 8,536,615 | B1 | 9/2013 | Driscoll et al. |
| 8,575,592 | B2 | 11/2013 | Bergmann et al. |
| 9,985,168 | B1 | 5/2018 | Kuhr et al. |
| 2005/0191778 | A1 | 9/2005 | Ohtsuka et al. |
| 2008/0237570 | A1 | 10/2008 | Choi et al. |
| 2009/0206325 | A1* | 8/2009 | Biwa ...................... H01L 33/12 257/28 |
| 2010/0123119 | A1 | 5/2010 | Kim et al. |
| 2010/0187497 | A1 | 7/2010 | Nago et al. |
| 2011/0187294 | A1* | 8/2011 | Bergmann ............. H01L 33/04 315/363 |
| 2012/0153258 | A1 | 6/2012 | Kato et al. |
| 2012/0248407 | A1* | 10/2012 | Toyoda .................. H01L 33/06 257/13 |
| 2012/0298955 | A1 | 11/2012 | Emerson et al. |
| 2013/0069033 | A1 | 3/2013 | Kushibe et al. |
| 2013/0153858 | A1* | 6/2013 | Konno ................. H01L 33/025 257/13 |
| 2013/0328010 | A1 | 12/2013 | Yu et al. |
| 2013/0341593 | A1 | 12/2013 | Bergmann et al. |
| 2014/0048771 | A1* | 2/2014 | Takahashi ............... H01L 33/06 257/13 |
| 2015/0034900 | A1* | 2/2015 | Aihara .................... H01L 33/20 257/13 |
| 2015/0083994 | A1* | 3/2015 | Jain ..................... H01L 33/0025 257/13 |
| 2015/0221815 | A1 | 8/2015 | Clatterbuck et al. |
| 2016/0093770 | A1* | 3/2016 | Shen ....................... H01L 33/32 257/94 |
| 2017/0098746 | A1* | 4/2017 | Bergmann ............. H01L 33/10 |
| 2018/0108805 | A1* | 4/2018 | Shatalov ................ B82Y 10/00 |
| 2018/0226538 | A1* | 8/2018 | Shur ...................... H01L 33/04 |
| 2018/0254377 | A1 | 9/2018 | Kuhr et al. |

OTHER PUBLICATIONS

Non-Final Office Action for U.S. Appl. No. 14/546,524, dated Jul. 6, 2015, 9 pages.

Final Office Action for U.S. Appl. No. 14/546,524, dated Oct. 2, 2015, 11 pages.

Final Office Action for U.S. Appl. No. 14/546,524, dated Dec. 30, 2015, 14 pages.

Advisory Action for U.S. Appl. No. 14/546,524, dated Apr. 5, 2016, 3 pages.

Notice of Allowance for U.S. Appl. No. 14/546,524, dated Jan. 25, 2018, 7 pages.

Notice of Allowance and Examiner-Initiated Interview Summary for U.S. Appl. No. 15/970,959, dated Oct. 19, 2018, 11 pages.

Non-Final Office Action for U.S. Appl. No. 16/998,651, dated Oct. 2, 2020, 9 pages.

Notice of Allowance for U.S. Appl. No. 16/267,636, dated Apr. 16, 2020, 9 pages.

Kwon et al., "Gradient Doping of Mg in p-Type GaN for High Efficiency InGaN—GaN Ultravioulet Light-Emitting Diode," IEEE Photonics Technology Letters, vol. 19, No. 23, Dec. 1, 2007, pp. 1880-1882.

Notice of Allowance for U.S. Appl. No. 16/998,651, dated Feb. 22, 2021, 9 pages.

* cited by examiner

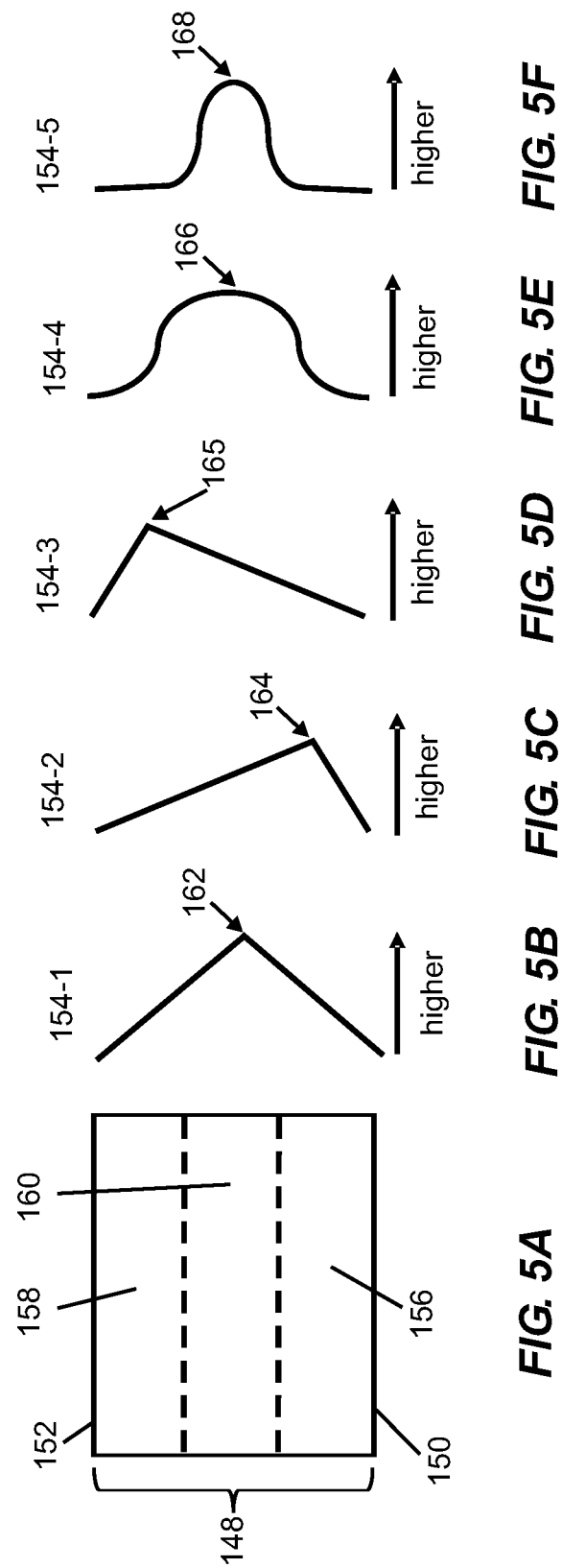

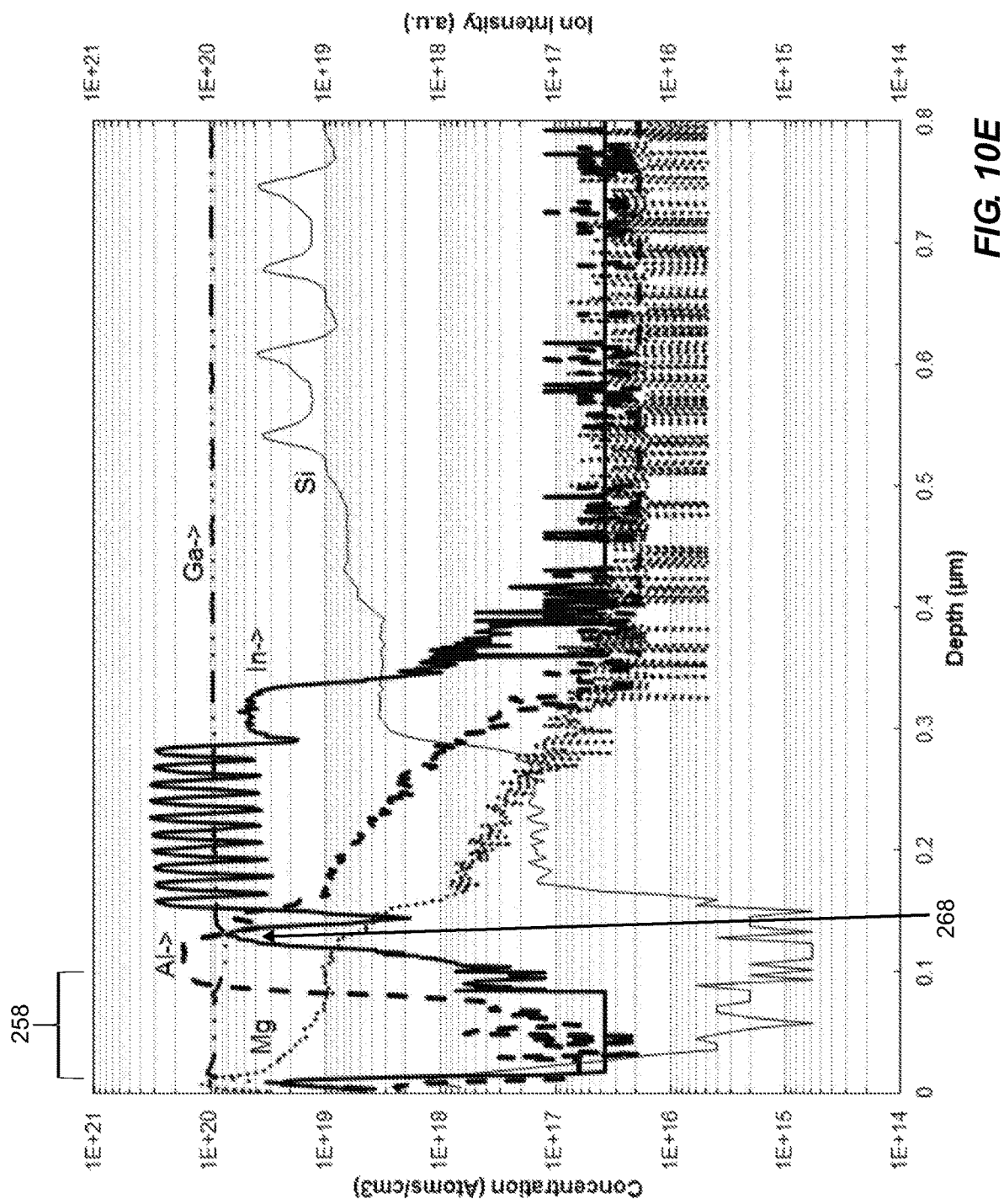

GROUP III NITRIDE LED STRUCTURES WITH IMPROVED ELECTRICAL PERFORMANCE

FIELD OF THE DISCLOSURE

The present disclosure relates to microelectronic devices and associated fabrication methods, and more particularly to structures that may be utilized in Group III nitride-based semiconductor devices such as light emitting diodes (LEDs).

BACKGROUND

Light emitting diodes (LEDs) are widely used in consumer and commercial applications. Continued developments in LED technology have resulted in highly efficient and mechanically robust light sources arranged to output emissions in the visible spectrum and beyond. These attributes, coupled with the long service life of solid state devices, have enabled a variety of new display applications, and have resulted in use of LEDs in general illumination applications with the potential to replace incandescent and fluorescent lamps.

As is well known to those skilled in the art, an LED generally includes an n-type region and a p-type region that form a p-n junction, and an active region that is located near the p-n junction. The active region is typically fabricated from a material having a suitable bandgap such that electron-hole recombination results in the generation of light when current is passed through the device. In particular, materials in the Group III nitride material system, such as gallium nitride (GaN), indium gallium nitride (InGaN), aluminum gallium nitride (AlGaN), aluminum indium gallium nitride (AlInGaN), etc., have been proven useful for generating blue, green, and ultraviolet light with relatively high efficiency.

Group III nitride-based LEDs may be fabricated on growth substrates (e.g., silicon carbide substrates) to provide horizontal devices (with both electrical contacts on a same side of the LED) or vertical devices (with electrical contacts on opposite sides of the LED). The growth substrate may be maintained on the LED after fabrication, or may be removed by techniques such as by chemical etching, grinding, polishing, laser lift-off, or other suitable processes. Removal of a growth substrate may beneficially reduce a thickness of the resulting LED and/or reduce a forward voltage through a vertical LED. A horizontal device (with or without the growth substrate), for example, may be flip-chip bonded (e.g., using solder) to a carrier substrate or printed circuit board, or wire bonded. A vertical device (with or without the growth substrate) may include first and second terminals bonded to a carrier substrate or printed circuit board.

Attempts to improve light output and other electrical characteristics of Group III nitride-based devices have included providing differing configurations of the n-type regions, p-type regions, and active regions of the devices. Such attempts have, for example, included the use of single and/or double heterostructure epitaxial structures. Similarly, epitaxial structures that include one or more Group III nitride quantum wells have also been fabricated. While such attempts have made improvements to the electrical characteristics of Group III nitride-based devices, further improvements may still be achieved.

One problem that has been experienced with Group III nitride devices is "current droop," a phenomenon in which light output increases with current density up to a point, and then begins to level off. Thus, device efficiency may drop off at higher currents. Without being bound by any particular theory, it is presently believed that current droop may be the result of one or more factors, including saturation of hole injection and/or inefficient (i.e., non-light generating) electron-hole recombination at higher device currents. A similar or related problem that has been experienced with Group III nitride-based devices is "thermal droop," a phenomenon in which light output decreases with elevated operating temperature. Such phenomenon may be attributable at least in part to the fact that the probability of non-radiative (i.e., non-light-emitting) recombination of electrons and holes increases with temperature. Reductions in luminous flux may cause undesirable and perceptible color shifts at elevated temperatures, particularly in lighting devices with multiple emitters.

Additional considerations that impact Group III nitride device design and/or operation are efficiency and forward voltage. Adjustment of certain parameters that may beneficially enhance charge confinement in quantum wells or other electrical characteristics may also result in detrimental increases in forward voltage (i.e., the minimum voltage difference between an anode and cathode required to conduct electricity and activate an LED). Balancing such considerations can complicate Group III nitride-based device design. A need exists for Group III-nitride based devices with improved performance.

SUMMARY

Aspects disclosed herein relate to Group III nitride light emitting diode (LED) structures with improved electrical performance. A Group III nitride LED structure includes one or more n-type layers, one or more p-type layers, and an active region that includes a plurality of sequentially arranged barrier-well units. In certain embodiments, doping profiles of barrier layers of the barrier-well units are configured such that a doping concentration in some barrier-well units is different than a doping concentration in other barrier-well units. In certain embodiments, a doping profile of a particular barrier layer is non-uniform. For example, a maximum dopant concentration within a barrier layer may be located between an upper boundary and a lower boundary of the barrier layer. In addition to active region configurations, the doping profiles and sequence of the n-type layers and p-type layers are configured to provide Group III nitride structures with higher efficiency, lower forward voltages, and improved forward voltage performance at elevated currents and temperatures.

In one aspect, an LED comprises an active region comprising a plurality of sequentially arranged barrier-well units, wherein each barrier-well unit comprises an $Al_aIn_bGa_{1-a-b}N$ barrier layer and an $In_bGa_{1-b}N$ well layer; wherein the plurality of sequentially arranged barrier-well units comprises a first barrier-well unit and a plurality of second barrier-well units; and wherein an $Al_aIn_bGa_{1-a-b}N$ barrier layer of the first barrier-well unit comprises a higher n-type doping concentration than an n-type doping concentration of each $Al_aIn_bGa_{1-a-b}N$ barrier layer of the plurality of second barrier-well units. In certain embodiments, in the $Al_aIn_bGa_{1-a-b}N$ barrier layer, $0 \leq a \leq 0.50$ and $0 \leq b \leq 0.10$, and in the $In_bGa_{1-b}N$ well layer, $c > 0.05$ and $c > 2 \cdot b$. The LED may further comprise an n-type GaN layer, wherein the first barrier-well unit is arranged between the n-type GaN layer and the plurality of second barrier-well units. In certain embodiments, the LED further comprises a spacer layer arranged between the n-type GaN layer and the first barrier-well unit, wherein the spacer layer comprises a first sublayer and a second sublayer and the first sublayer has a higher n-type doping concentration than the second sublayer. The LED may further comprise a superlattice structure arranged between the spacer layer and the first barrier-well unit.

In certain embodiments, the $Al_aIn_bGa_{1-a-b}N$ barrier layer of the first barrier-well unit comprises an n-type doping concentration that is at least two times higher than an n-type doping concentration of each $Al_aIn_bGa_{1-a-b}N$ barrier layer of the plurality of second barrier-well units. In certain embodiments, the $Al_aIn_bGa_{1-a-b}N$ barrier layer of the first barrier-well unit comprises an n-type doping concentration that is at least five times higher than an n-type doping concentration of each $Al_aIn_bGa_{1-a-b}N$ barrier layer of the plurality of second barrier-well units. In certain embodiments, the $Al_aIn_bGa_{1-a-b}N$ barrier layer of the first barrier-well unit comprises an n-type doping concentration within a range of from (i) at least two times higher than an n-type doping concentration of each $Al_aIn_bGa_{1-a-b}N$ barrier layer of the plurality of second barrier-well units to (ii) no more than ten times higher than an n-type doping concentration of each $Al_aIn_bGa_{1-a-b}N$ barrier layer of the plurality of second barrier-well units. In certain embodiments, the $Al_aIn_bGa_{1-a-b}N$ barrier layer of the first barrier-well unit comprises an n-type doping concentration of no more than one hundred times higher than an n-type doping concentration of each $Al_aIn_bGa_{1-a-b}N$ barrier layer of the plurality of second barrier-well units.

In certain embodiments, the LED further comprises an $Al_gIn_hGa_{1-g-h}N$ cap layer, wherein $0<g<1$, $0\le h<1$, and $g+h<1$; a p-type $In_jGa_{1-j}N$ layer, wherein $0\le j<1$; and a p-type $Al_kIn_mGa_{1-k-m}N$ layer, wherein $0<k<1$, $0\le m<1$, and $k+m<1$; wherein the $Al_gIn_hGa_{1-g-h}N$ cap layer is arranged between the active region and the p-type $In_jGa_{1-j}N$ layer; and wherein the p-type $In_jGa_{1-j}N$ layer is arranged between the $Al_gIn_hGa_{1-g-h}N$ cap layer and the p-type $Al_kIn_mGa_{1-k-m}N$ layer. The LED may further comprise a p-type GaN layer, wherein the p-type $Al_kIn_mGa_{1-k-m}N$ layer is arranged between the p-type $In_jGa_{1-j}N$ layer and the p-type GaN layer.

In certain embodiments, the p-type GaN layer comprises: a first p-type GaN sublayer with a first p-type doping concentration; a second p-type GaN sublayer with a second p-type doping concentration; a third p-type GaN sublayer with a third p-type doping concentration; and a fourth p-type GaN sublayer with a fourth p-type doping concentration; wherein the fourth p-type doping concentration is about equal to the second p-type doping concentration; wherein the first p-type doping concentration is in a range of from about 1% to about 20% of the fourth p-type doping concentration; and wherein the third p-type doping concentration is in a range of from about 25% to about 75% of the fourth p-type doping concentration.

In certain embodiments, the p-type GaN layer comprises: a first p-type GaN sublayer with a first p-type doping concentration; a second p-type GaN sublayer with a second p-type doping concentration; and a third p-type GaN sublayer with a third p-type doping concentration; wherein the first p-type doping concentration and the second p-type doping concentration are in a range of from about 5% to about 35% of the third p-type doping concentration. In certain embodiments, in the p-type $In_jGa_{1-j}N$ layer, $j>0$.

In certain embodiments, at least one barrier-well unit, but fewer than all barrier-well units, of the plurality of sequentially arranged barrier-well units additionally comprises an $Al_eIn_fGa_{1-e-f}N$ interface layer (wherein $e>0$ and wherein $e\ge f$).

In another aspect, an LED comprises: an active region comprising a plurality of sequentially arranged barrier-well units, wherein each barrier-well unit comprises an $Al_aIn_bGa_{1-a-b}N$ barrier layer and an $In_cGa_{1-c}N$ well layer; wherein each $Al_aIn_bGa_{1-a-b}N$ barrier layer of the plurality of sequentially arranged barrier-well units comprises a lower boundary, an upper boundary and an n-type doping concentration that is non-uniform between the upper boundary and the lower boundary, with a maximum n-type doping concentration located between the upper boundary and the lower boundary. In certain embodiments, in the $Al_aIn_bGa_{1-a-b}N$ barrier layer, $0\le a\le 0.50$ and $0\le b\le 0.10$, and in the $In_cGa_{1-c}N$ well layer, $c>0.05$ and $c>2\cdot b$.

In certain embodiments, each $Al_aIn_bGa_{1-a-b}N$ barrier layer of the plurality of sequentially arranged barrier-well units comprises a thickness extending between the lower boundary and the upper boundary; the thickness is divisible into a lower third proximate to the lower boundary, an upper third proximate to the upper boundary, and a middle third arranged between the lower third and the upper third; and the maximum n-type doping concentration is located within the middle third. In certain embodiments, a carrier concentration of the n-type doping is within a range of 1E+17 and 3E+17 atoms per cubic centimeter.

In certain embodiments, at least one barrier-well unit, but fewer than all barrier-well units, of the plurality of sequentially arranged barrier-well units, additionally comprises an $Al_eIn_fGa_{1-e-f}N$ interface layer wherein $e>0$ and wherein $e\ge f$.

In certain embodiments, the LED further comprises: an n-type GaN layer; and a spacer layer arranged between the n-type GaN layer and the active region; wherein the spacer layer comprises a first sublayer and a second sublayer and the first sublayer has a higher n-type doping concentration than the second sublayer. The LED may further comprise a superlattice structure arranged between the spacer layer and the active region. In certain embodiments, the LED further comprises an $Al_gIn_hGa_{1-g-h}N$ cap layer, wherein $0<g<1$, $0\le h<1$, and $g+h<1$; a p-type $In_jGa_{1-j}N$ layer, wherein $0\le j<1$; and a p-type $Al_kIn_mGa_{1-k-m}N$ layer, wherein $0<k<1$, $0\le m<1$, and $k+m<1$; wherein the $Al_gIn_hGa_{1-g-h}N$ cap layer is arranged between the active region and the p-type $In_jGa_{1-j}N$ layer; and wherein the p-type $In_jGa_{1-j}N$ layer is arranged between the $Al_gIn_hGa_{1-g-h}N$ cap layer and the p-type $Al_kIn_mGa_{1-k-m}N$ layer. The LED may further comprise a p-type GaN layer, wherein the p-type $Al_kIn_mGa_{1-k-m}N$ layer is arranged between the p-type $In_jGa_{1-j}N$ layer and the p-type GaN layer.

In certain embodiments, the p-type GaN layer comprises: a first p-type GaN sublayer with a first p-type doping concentration; a second p-type GaN sublayer with a second p-type doping concentration; a third p-type GaN sublayer with a third p-type doping concentration; and a fourth p-type GaN sublayer with a fourth p-type doping concentration; wherein the fourth p-type doping concentration is about equal to the second p-type doping concentration; wherein the first p-type doping concentration is in a range of from about 1% to about 20% of the fourth p-type doping concentration; and wherein the third p-type doping concentration is in a range of from about 25% to about 75% of the fourth p-type doping concentration.

In certain embodiments, the p-type GaN layer comprises: a first p-type GaN sublayer with a first p-type doping concentration; a second p-type GaN sublayer with a second p-type doping concentration; and a third p-type GaN sublayer with a third p-type doping concentration; wherein the first p-type doping concentration and the second p-type doping concentration are in a range of from about 5% to about 35% of the third p-type doping concentration. In certain embodiments, in the p-type $In_bGa_{1-a-b}N$ layer, b>0.

In another aspect, an LED comprises an active region comprising a plurality of sequentially arranged barrier-well units, wherein each barrier-well unit comprises an $Al_aIn_bGa_{1-a-b}N$ barrier layer wherein 0≤a≤0.50 and 0≤b≤0.10 and an $In_cGa_{1-c}N$ well layer wherein c>0.05 and c>2·b; a p-type $Al_kIn_mGa_{1-k-m}N$ layer wherein 0<k<1, 0≤m<1, and k+m<1; and a p-type GaN layer on the p-type $Al_kIn_mGa_{1-k-m}N$ layer, wherein the p-type GaN layer comprises: a first p-type GaN sublayer with a first p-type doping concentration; a second p-type GaN sublayer with a second p-type doping concentration; a third p-type GaN sublayer with a third p-type doping concentration; and a fourth p-type GaN sublayer with the second p-type doping concentration; wherein the first p-type doping concentration is in a range of about 1% to 20% of the second p-type doping concentration; and wherein the third p-type doping concentration is in a range of about 25% to 75% of the second p-type doping concentration. In certain embodiments, the LED further comprises: an $Al_gIn_hGa_{1-g-h}N$ cap layer, wherein 0<g<1, 0≤h<1, and g+h<1; and a p-type $In_jGa_{1-j}N$ layer, wherein 0≤j<1; wherein the $Al_gIn_hGa_{1-g-h}N$ cap layer is arranged between the active region and the p-type $In_jGa_{1-j}N$ layer; and wherein the p-type $In_jGa_{1-j}N$ layer is arranged between the $Al_gIn_hGa_{1-g-h}N$ cap layer and the a p-type $Al_kIn_mGa_{1-k-m}N$ layer.

In another aspect, an LED comprises an active region comprising a plurality of sequentially arranged barrier-well units, wherein each barrier-well unit comprises an $Al_aIn_bGa_{1-a-b}N$ barrier layer wherein 0≤a≤0.50 and 0≤b≤0.10 and an $In_cGa_{1-c}N$ well layer wherein c>0.05 and c>2·b; a p-type $Al_kIn_mGa_{1-k-m}N$ layer wherein 0<k<1, 0≤m<1, and k+m<1; and a p-type GaN layer on the p-type $Al_kIn_mGa_{1-k-m}N$ layer, wherein the p-type GaN layer comprises a first p-type GaN sublayer with a first p-type doping concentration; a second p-type GaN sublayer with a second p-type doping concentration; and a third p-type GaN sublayer with a third p-type doping concentration; wherein the first p-type doping concentration and the second p-type doping concentration are in a range of from about 5% to about 35% of the third p-type doping concentration. In certain embodiments, the LED further comprises: an $Al_gIn_hGa_{1-g-h}N$ cap layer, wherein 0<g<1, 0≤h<1, and g+h<1; and a p-type $In_jGa_{1-j}N$ layer, wherein 0≤j<1; wherein the $Al_gIn_hGa_{1-g-h}N$ cap layer is arranged between the active region and the p-type $In_jGa_{1-j}N$ layer; and wherein the p-type $In_jGa_{1-j}N$ layer is arranged between the $Al_gIn_hGa_{1-g-h}N$ cap layer and the a p-type $Al_kIn_mGa_{1-k-m}N$ layer.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 5A is a side cross-sectional schematic view of a barrier layer of a barrier-well unit according to certain embodiments disclosed herein.

FIGS. 5B-5F illustrate various non-uniform doping profiles that may be employed within the barrier layer of FIG. 5A and used in certain embodiments disclosed herein.

FIG. 10E is a SIMS analysis plot for the LED structure of FIG. 10A in which the active region is similar to the active region of FIG. 7; and the $Al_gIn_hGa_{1-g-h}N$ cap layer, the p-type $In_jGa_{1-j}N$ layer, the p-type $Al_kIn_mGa_{1-k-m}N$ layer, the p-type GaN layer, and the p-type InGaN contact layer being similar to the corresponding layers of FIG. 9.

DETAILED DESCRIPTION

Figure 1:
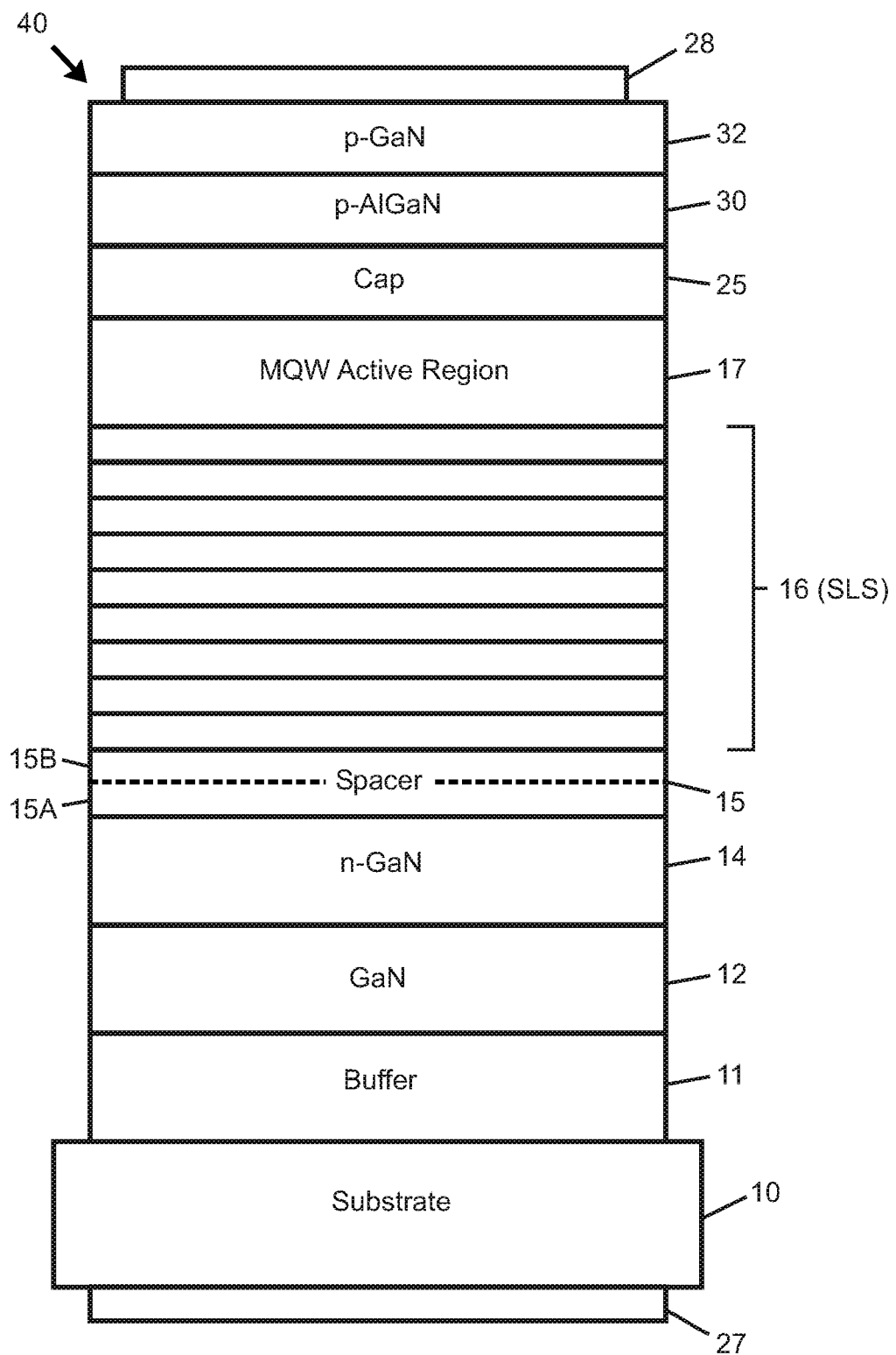
FIG. 1 is a cross-sectional schematic view of a light emitting diode (LED) structure according to one embodiment.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

As used herein, an "active region" of a light emitting device refers to the region in which majority and minority electronic carriers (e.g., holes and electrons) recombine to produce light. In general, an active region according to embodiments disclosed herein can include a double heterostructure or a well structure, such as a quantum well structure. The quantum well structure may include multiple well structures, which is commonly referred to as a multiple quantum well (MQW). "Group III nitride layers" or "nitride layers" as used herein refer to nitride-based III-V semiconductor layers, such as gallium nitride (GaN), indium nitride (InN), aluminum nitride (AlN), indium gallium nitride (InGaN), aluminum gallium nitride (AlGaN), and/or aluminum indium gallium nitride (AlInGaN). In certain instances, Group III nitride materials are specified herein with subscripts (e.g., "a," "b," "c," "d," "e," "f," "g," "h," "j," "k," "m," "x," "y" optionally modified with subscripts "1" or "2") denoting concentrations or relative concentrations of metals Al, In, and/or Ga. Unless indicated to the contrary herein, relative fractions of such metals may be in a range of from 0% to 100%.

Various Group III nitride layers as described herein may be doped with n-type impurities or p-type impurities. A common n-type impurity, or dopant, for Group III nitride layers is silicon (Si) and a common p-type impurity, or dopant, for Group III nitride layers is magnesium (Mg). As used herein, "undoped" refers to a layer or region that is not intentionally doped with impurities, and is synonymous with "unintentionally doped."

Aspects disclosed herein relate to Group III nitride light emitting diode (LED) structures with improved electrical performance. A Group III nitride LED structure includes one or more n-type layers, one or more p-type layers, and an active region that includes a plurality of sequentially arranged barrier-well units. In certain embodiments, doping profiles of barrier layers of the barrier-well units are configured such that a doping concentration in some barrier-well units is different than a doping concentration in other barrier-well units. In certain embodiments, a doping profile of a particular barrier layer is non-uniform. For example, a maximum dopant concentration within a barrier layer may be located between an upper boundary and a lower boundary of the barrier layer. In addition to the active region configuration, the doping profiles and sequence of the n-type layers and p-type layers are configured to provide Group III nitride structures with higher efficiency, lower forward voltages, and improved forward voltage performance at elevated currents and temperatures.

Embodiments of the present disclosure will be described with reference to FIG. 1, which illustrates a LED structure 40. Although layers are illustrated in FIG. 1 as having various thicknesses, it is to be appreciated that such layers are not drawn to scale, such that FIG. 1 is schematic only.

The LED structure 40 of FIG. 1 includes a layered semiconductor structure comprising GaN-based semiconductor layers on or over a substrate 10. As illustrated, the LED structure 40 includes the following layers: a nitride buffer layer 11 which may include AlGaN (e.g., n-AlGaN); a first nitride layer 12 which may include GaN, such as unintentionally doped GaN (uid GaN) or silicon-doped GaN (Si—GaN); a second nitride layer 14 which may include Si—GaN; an optional spacer layer 15 which may include undoped or n-type doped GaN; a nitride superlattice structure 16, or SLS, that may include alternating layers of Si—GaN and/or InGaN; a nitride active region 17 which may embody a multiple well structure such as a MQW structure; a nitride (e.g., undoped) cap layer 25 which may include AlGaN; a nitride layer 30 which may include AlGaN doped with a p-type impurity; and a nitride contact layer 32 also doped with a p-type impurity. An n-type ohmic contact 27 is provided on the substrate 10, and a p-type ohmic contact 28 is provided on the nitride contact layer 32. The Group III nitride layers of the LED structure 40 are typically formed by metal organic chemical vapor deposition (MOCVD) sequentially on the substrate 10. In general, Group III nitride-based layers may be grown using ammonia as a source gas together with one or more carrier gases such as hydrogen ($H_2$), nitrogen ($N_2$), inert gases, and/or mixtures thereof.

The labels of the layers in FIG. 1 are provided as examples only, such that structures according to certain embodiments herein may include layers formed of different materials than the specific materials indicated in FIG. 1.

Epitaxial layer structures for Group III nitride-based LEDs are typically formed by growing the n-type (and undoped) layers first, then growing the p-type layers on or over the n-type layers, to avoid reactor memory effects which can cause p-type dopants to remain in the system even after the flow of the source gas for such dopants has been switched off. Thus, for example, an LED structure such as the LED structure 40 illustrated in FIG. 1 is typically formed by epitaxially growing, in order, the buffer layer 11, the nitride layers 12, 14, the optional spacer layer 15, the superlattice structure 16, the active region 17, the cap layer 25, the p-AlGaN layer 30, and the nitride contact layer 32, on a growth substrate 10.

The substrate 10 of the LED structure 40 illustrated in FIG. 1 may be any material compatible for growth of Group III nitride material layers. In certain embodiments, the substrate 10 may be 4H or 6H n-type silicon carbide. In other embodiments, the substrate 10 may include sapphire, GaN, silicon (Si), or other epitaxially compatible substrate materials. It is to be appreciated, however, that the substrate 10 is optional and may be omitted from the final LED device structure 40 in certain embodiments.

The nitride buffer layer 11 may include n-type AlGaN having a constant or graded aluminum composition. Examples of buffer layers arranged between silicon carbide and Group III nitride materials are provided in U.S. Pat. Nos. 5,393,993, 5,523,589, and 7,034,328, which are assigned to the assignee of the present invention, with the disclosures of such patents being hereby incorporated by reference herein. Embodiments of the present disclosure may further include structures such as those described in U.S. Pat. No. 6,201,262 entitled "Group III Nitride Photonic Devices on Silicon Carbide Substrates with Conductive Buffer Interlayer Structure," with the disclosure of such patent being hereby incorporated by reference herein. In certain embodiments, the buffer layer 11 may have a thickness in a range of from 1000 Angstroms (Å) to about 5000 Å; in certain embodiments, the buffer layer 11 may have a thickness selected from one of, or in a range between two values of, the following values: 1800 Å, 2000 Å, 2200 Å, 2400 Å, 2600 Å, 2800 Å, 3000 Å, 3200 Å, 3400 Å, 3600 Å, 4000 Å, 4300 Å, 4700 Å, and 5000 Å.

Group III nitride-based LEDs according to certain embodiments may be provided as horizontal devices (e.g., with both electrical contacts on a same side of the LED) or vertical devices (e.g., with electrical contacts on opposite sides of the LED). The Group III nitride structures may be arranged to be mounted in flip-chip configurations. For example, a horizontal device may be flip-chip mounted such that the electrical contacts are closest to a mounting surface. Moreover, the growth substrate may be maintained on the LED after fabrication, or may be removed by any appropriate process known in the art.

In certain embodiments, the first nitride layer 12 may have a thickness in a range of from 500 nm to 6000 nm, and in certain embodiments may have a thickness of about 4000 nm. In other embodiments, the first nitride layer 12 may have a thickness in a range of from 500 Å to 30,000 Å, or a thickness of at least 7500 Å, at least 10,000 Å, at least 12,500 Å, at least 15,000 Å, or at least 17,500 Å, optionally bounded by an upper limit of 30,000 Å. In certain embodiments, the first nitride layer 12 may be undoped or unintentionally doped. In other embodiments, the first nitride layer 12 may be doped with Si at a concentration of from about $5 \times 10^{17}$ $cm^{-3}$ to $1 \times 10^{19}$ $cm^{-3}$.

In certain embodiments, the second nitride layer 14 may have a thickness in a range of from about 10 Å to about 500 Å, with the thickness being about 80 Å in certain embodiments. In other embodiments, the second nitride layer 14 may have a thickness in a range of from 20,000 Å to 70,000 Å, or in a range of from 20,000 Å to 60,000 Å, or in a range of from 23,000 Å to 50,000 Å, or in a range of from 25,000 Å to 40,000 Å. In certain embodiments, the second nitride layer 14 may have a thickness of at least 20,000 Å, at least 23,000 Å, at least 25,000 Å, at least 27,000 Å, or at least 30,000 Å, with a maximum value bounding the preceding minimum thresholds preferably being about 50,000 Å in certain embodiments. In certain embodiments, the second nitride layer 14 may be doped with Si at a concentration of less than about $5 \times 10^{19}$ $cm^{-3}$. In certain embodiments, the second nitride layer 14 may include a doping profile that is non-uniform. For example, the second nitride layer 14 may include a region with a higher n-type doping concentration and a region with a lower n-type doping concentration. In certain embodiments, the second nitride layer 14 may be doped with modulated doping or delta doping structures and methods as described in U.S. Pat. No. 8,536,615, which is assigned to the assignee of the present invention, with the disclosures of such patent being hereby incorporated by reference herein.

In embodiments that include the spacer layer 15, the spacer layer 15 may include a GaN layer doped with an n-type impurity such as Si. The spacer layer 15 may have a thickness in a range of about 100 Å to about 1200 Å and an n-type doping concentration of from about $2\times10^{18}$ cm$^{-3}$ to $1\times10^{19}$ cm$^{-3}$. In certain embodiments, the spacer layer 15 may include two or more regions in which a first region includes a different thickness and/or a differing doping concentration than a second region. For example, in certain embodiments, the spacer layer 15 includes a first sublayer 15A having a thickness in a range of about 200 Å to about 400 Å with an n-type doping concentration of from about $7\times10^{18}$ cm$^{-3}$ to $9\times10^{18}$ cm$^{-3}$ and a second sublayer 15B having a thickness in a range of about 600 Å to about 800 Å with an n-type doping concentration of from about $4\times10^{18}$ cm$^{-3}$ to $6\times10^{18}$ cm$^{-3}$. In other embodiments, the first sublayer 15A may have an n-type doping concentration of from about $5\times10^{18}$ cm$^{-3}$ to $7\times10^{18}$ cm$^{3}$ and the second sublayer 15B may have an n-type doping concentration of from about $3\times10^{18}$ cm$^{3}$ to $5\times10^{18}$ cm$^{-3}$. In this regard, the spacer layer 15 may serve as a transition between the second nitride layer 14 and the superlattice structure 16, thereby providing an improved quality layer and surface on which the superlattice structure 16 may be formed. Accordingly, resulting LED structures may have improved tolerance to electrostatic discharge (ESD).

In certain embodiments, the superlattice structure 16 is provided between the substrate 10 and the active region 17. In certain embodiments, the superlattice structure 16 may be omitted. Omission of the superlattice structure 16 may be accompanied by presence of the second nitride layer 14 having a thickness of preferably at least about 20,000 Å, such as within a thickness range outlined above.

If present, the superlattice structure 16 may provide a better surface for growth of the nitride (e.g., InGaN-based) active region 17. While not wishing to be bound by any theory of operation, it is presently believed that strain effects in the superlattice structure 16 provide a growth surface that is conducive to the growth of a high-quality InGaN-containing active region. Further, a superlattice may influence operating voltage of a device. Appropriate choice of thickness and composition of the superlattice structure 16 can reduce operating voltage and/or enhance optical efficiency.

In certain embodiments including the superlattice structure 16, the superlattice structure 16 may be grown in an atmosphere of nitrogen or other gas, enabling growth of high-quality InGaN layers. By growing a silicon-doped InGaN/GaN superlattice on a silicon-doped GaN layer in a nitrogen atmosphere, a structure having improved crystallinity and/or conductivity with optimized strain may be realized. In general, GaN-based layers in the structure may be grown using ammonia as a source gas together with one or more carrier gases such as H$_2$, N$_2$, inert gases, and/or mixtures thereof.

In certain embodiments including the superlattice structure 16, the superlattice structure 16 may include alternating layers of In$_x$Ga$_{1-x}$N and In$_y$Ga$_{1-y}$N, wherein x is in a range including 0 and 1, and x is not equal to y. In certain embodiments, x=0 so that the superlattice structure 16 includes alternating layers of GaN and InGaN. In certain embodiments, each alternating layer of InGaN has a thickness in a range of from about 5 Å to 40 Å, and each alternating layer of GaN has a thickness in a range of from 5 Å to 100 Å. In certain embodiments, each GaN layer has a thickness of about 50 Å and each InGaN layer has a thickness of about 15 Å. In other embodiments, each GaN layer has a thickness in a range from about 10 Å to 15 Å and each InGaN layer has a thickness in a range from about 5 Å to 7 Å. In certain embodiments, the superlattice structure 16 may include from about 5 to about 50 periods (where one period equals one repetition of an In$_x$Ga$_{1-x}$N layer and an In$_y$Ga$_{1-y}$N layer of the repeating layers that form the superlattice structure 16). In certain embodiments, the superlattice structure 16 may include about twenty-five periods or about twenty periods. In another embodiment, the superlattice structure 16 includes about ten periods. In certain embodiments, the number of periods may be decreased, for example, by increasing the thickness of the respective layers. Thus, for example, doubling the thickness of the respective layers of the superlattice structure 16 may cause only half the number of periods to be used. In other embodiments, the number of the periods and the thickness of the layers of the superlattice structure 16 may be independent of one another.

In certain embodiments including the superlattice structure 16, the superlattice structure 16 may be doped with an n-type impurity such as Si at a concentration of from about $1\times10^{17}$ cm$^{-3}$ to $5\times10^{19}$ cm$^{-3}$. In certain embodiments, the superlattice structure 16 may be doped with an n-type impurity such as Si at a concentration of from about $2\times10^{18}$ cm$^{-3}$ to $4\times10^{18}$ cm$^{-3}$. Such a doping concentration may embody actual doping, or average doping, of the layers of the superlattice structure 16. If such doping embodies an average doping concentration, then it may be beneficial to provide doped layers adjacent the superlattice structure 16 whereby the adjacent doped layers (not shown) are considered together with the layers of the superlattice structure 16 for purposes of calculating a desired average doping concentration. In still further embodiments, the n-type impurities may be introduced during deposition of only one of the layers in each period of the superlattice structure 16. For example, in a GaN/InGaN supperlattice, an n-type impurity such as Si may only be introduced during growth of the GaN layer. In other embodiments, the n-type impurity may be present during deposition of all layers of the supperlattice structure 16.

The active region 17 includes multiple light emitting wells that include thin layers of low bandgap semiconductor material sandwiched between higher bandgap cladding or confinement layers, and that may in certain embodiments be quantum wells. A well layer is a very thin layer of semiconductor material (typically less than about 50 nm, or less than about 40 nm in certain embodiments) surrounded by barrier or confinement layers having higher bandgaps than the quantum well layer. The barrier layers and the well layer together form a quantum well. In particular, a quantum well layer is so thin that allowable energy levels in the quantum well take on discrete values, so that a quantum well exhibits a high density of states at the lowest allowed (discrete) energy level as compared to bulk material, which has a smooth distribution of allowable energy levels. A quantum well may generate photons by carrier recombination with improved efficiency and/or spectral purity as compared to bulk recombination/emission. Carrier recombination occurs when an electron fills a space in a crystal lattice occupied by a hole and moves to a lower energy state, releasing energy in the form of heat and/or light. In various embodiments, the wells may or may not be thin enough to be characterized as quantum wells.

Figure 2:
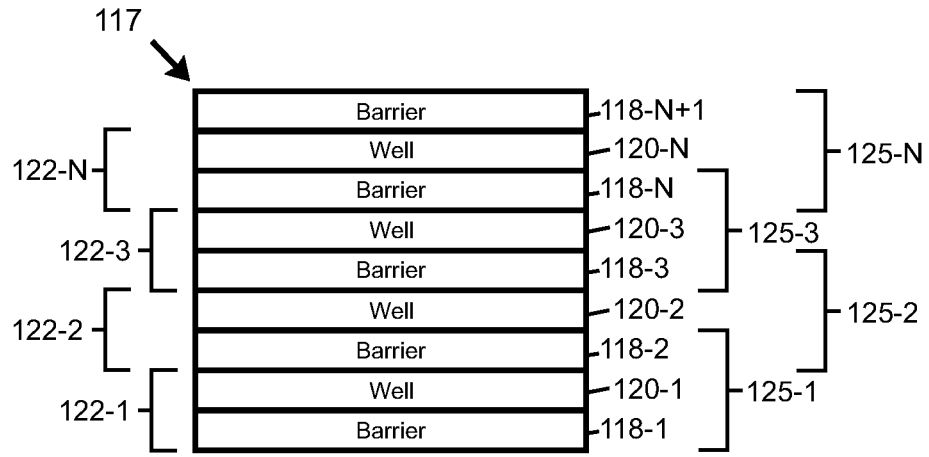
FIG. 2 is a side cross-sectional schematic view of an active region of an LED structure according to one embodiment.

In certain embodiments disclosed herein, the active region 17 includes a multiple well structure that includes multiple barrier-well units (such as shown in FIG. 2).

In the LED structure 40 as illustrated in FIG. 1, minority carriers (e.g., holes) are injected from a P-N junction into the active region 17. In certain embodiments, the P-N junction is positioned at or near the active region 17, such as within a range of from 0 Å to 500 Å thereof. The injected minority carriers (e.g., holes) may diffuse into one of the quantum wells in the active region 17, where they can recombine with majority carriers (e.g., electrons) and result in the generation of photons of light. The P-N junction may be positioned close enough to the active region 17 that an injected minority carrier can diffuse with a high probability into the active region 17 and recombine with a majority carrier in a quantum well. Depending on the n-type doping and the p-type doping in various layers of the LED structure 40, the P-N junction could be configured in various locations above or below the active region 17.

Although the active region 17 may superficially resemble a superlattice, the active region 17 can be distinguished from the superlattice structure 16 (if present) in multiple ways. In particular, bandgaps of well layers in a well-based active region typically embody the lowest bandgaps of any layer in a device, so that carrier recombination is most likely to occur in a well layer of the active region 17. In certain embodiments, average percentages of indium in the superlattice structure 16 and the active region 17 are adjusted to ensure that a bandgap of the superlattice structure 16 exceeds a bandgap of the active region 17. By keeping the bandgap of the superlattice 16 higher than the bandgap of wells in the active region 17, unwanted absorption in a device may be reduced and luminescent emission may be increased. The bandgaps of the well layers in a well-based structure may be tailored to produce a desired wavelength of light emission. Furthermore, the active region 17 may be located closer to the P-N junction than the proximity of the superlattice structure 16 to the P-N junction. Additionally, the superlattice structure 16 may be intentionally doped to enhance conductivity, while in certain embodiments, the layers of the active region 17 may typically be only unintentionally doped.

Continuing to refer to FIG. 1, the cap layer 25 is provided on the active region 17 and may include a layer of undoped GaN, AlGaN and/or AlInGaN. In certain embodiments, the cap layer 25 may have a thickness in a range of 1 Å to 300 Å. It will be appreciated that Group III nitride-based materials are typically naturally n-type as grown, and therefore the cap layer 25 may be n-type as grown. In certain embodiments, the cap layer 25 may have a thickness of at least about 40 Å. If the cap layer 25 comprises AlGaN, then the aluminum percentage in such layer may be in a range of 0-70%, and in some cases may be about 55% or less. In certain embodiments, the presence or concentration of aluminum in the cap layer 25 may also be graded in a stepwise or continuously decreasing fashion. In certain embodiments, the cap layer 25 may be grown at a higher temperature than the temperature(s) at which one or more layers of the MQW active region 17 were grown in order to improve the crystal quality of the cap layer 25.

In certain embodiments, a p-type nitride-based layer 30 including AlGaN and/or AlInGaN doped with a p-type impurity such as Mg is provided on the cap layer 25. In certain embodiments, the p-type nitride-based layer 30 may have a thickness in a range of from 0 Å to 300 Å, and in some cases may have a thickness of about 150 Å.

In certain embodiments, the contact layer 32 (e.g., including p-type GaN and/or p-type InGaN) is provided on the p-type nitride-based layer 30. The contact layer 32 may have a thickness in a range of from 500 Å to 2500 Å, and in some cases may have a thickness of about 1800 Å.

In certain embodiments, the P-N junction may be formed at a junction between the p-type nitride-based layer 30 and the cap layer 25. In other embodiments, the p-type nitride-based layer 30 may be omitted so that the P-N junction may be formed between the contact layer 32 and the cap layer 25. In further embodiments, the P-N junction may be formed within the cap layer 25 by doping an upper portion of the cap layer 25 with p-type dopants. The P-N junction serves as a mechanism for injecting minority carriers into the active region 17, where such carriers can recombine with majority carriers to generate photons and result in light emission.

Barrier-well units and active regions of LED structures according to various embodiments will now be described, followed by discussion of such barrier-well units and active regions as incorporated into LED structures.

FIG. 2 is a side cross-sectional schematic view of an active region 117 embodying a MQW structure that may provide the active region of LED structure 40 illustrated in FIG. 1 in certain embodiments. The active region 117 includes a multiple well structure with multiple InGaN well layers 120-1 to 120-N (where N is a variable of any suitable value) separated by intervening barrier layers 118-1 to 118-N in an alternating fashion, and covered with an additional barrier layer 118-N+1. The barrier layers 118-1 to 118-N and 118-N+1 may generally include GaN, AlGaN, InGaN, or AlInGaN; however, the indium composition of the barrier layers 118-1 to 118-N and 118-N+1 is preferably less than that of the well layers 120-1 to 120-N, so that the barrier layers 118-1 to 118-N and 118-N+1 have a higher bandgap than the well layers 120-1 to 120-N. In certain embodiments, the barrier layers 118-1 to 118-N and 118-N+1 and the well layers 120-1 to 120-N may be undoped (i.e. not intentionally doped with an impurity atom such as Si or Mg). In other embodiments, however, it may be desirable to dope the barrier layers 118-1 to 118-N and 118-N+1 with Si (e.g., at a concentration of less than $5 \times 10^{19}$ $cm^{-3}$).

With continued reference to FIG. 2, within the active region 117, each well layer 120-1 to 120-N is positioned between two barrier layers 118-1 to 118-N and 118-N+1, to form multiple quantum wells 125-1 to 125-N each including a well layer and two barrier layers. Each combination of one barrier layer 118-1 to 118-N and one adjacent well layer 120-1 to 120-N may also be referred to as included in a "barrier-well unit," with multiple barrier-well units 122-1 to 122-N being illustrated in FIG. 2 as being sequentially arranged and covered with the additional barrier layer 118-N+1 to form the active region 117 that includes the multiple quantum wells 125-1 to 125-N.

In certain embodiments, an active region as disclosed herein includes multiple quantum wells, which encompass multiple barrier-well units. In certain embodiments, at least one barrier-well unit of an active region includes at least one interface layer in contact with a well and/or barrier layer. In certain embodiments, such interface layers embody thin layers (e.g., preferably less than or no greater than 10 Å thick) with a thickness less than (or no greater than) 5 Å, less than (or no greater than) 4 Å, or another thickness threshold disclosed herein, and/or preferably a thickness of no greater than about 30% of an adjacent well layer) of various compositions.

Figure 3A:
FIG. 3A is a side cross-sectional schematic view of a barrier-well unit of a first type that may be provided in a quantity of one or more in conjunction with at least one barrier-well unit of another type in an active region of an LED structure according to one embodiment.
Figure 3B:
FIG. 3B is a side cross-sectional schematic view of a barrier-well unit of a second type that may be provided in a quantity of one or more, optionally in conjunction with at least one barrier-well unit of another type, in an active region of an LED structure according to one embodiment.
Figure 3C:
FIG. 3C is a side cross-sectional schematic view of a third barrier-well unit of a third type that may be provided in a quantity of one or more, optionally in conjunction with at least one barrier-well unit of another type, in an active region of an LED structure according to one embodiment.
Figure 3D:
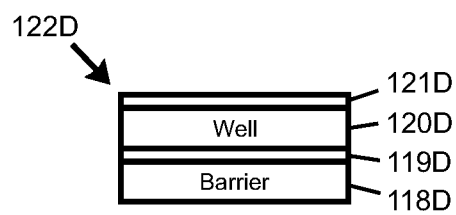
FIG. 3D is a side cross-sectional schematic view of a barrier-well unit of a fourth type that may be provided in a quantity of one or more, optionally in conjunction with at least one barrier-well unit of another type, in an active region of an LED structure according to one embodiment.

Four different barrier-well units 122A-122D are illustrated in FIGS. 3A-3D, with the barrier-well units 122B-122D of FIGS. 3B-3D each including at least one interface layer.

FIG. 3A illustrates the barrier-well unit 122A of a first type that may be provided in a quantity of one or more in conjunction with at least one barrier-well unit of another type (e.g., such as the barrier-well units 122B-122D described herein) in an active region of an LED structure according to certain embodiments. The barrier-well unit 122A includes a barrier layer 118A arranged in contact with a well layer 120A. The well layer 120A preferably has a greater indium composition than the barrier layer 118A, such that the well layer 120A has a larger bandgap than the barrier layer 118A. In certain embodiments, the well layer 120A comprises a thickness in a range of from 15 Å to 40 Å, and the barrier layer 118A comprises a thickness in a range of from 25 Å to 150 Å. In certain embodiments, the barrier layer 118A comprises $Al_aIn_bGa_{1-a-b}N$ wherein $0 \leq a \leq 0.50$ and $0 \leq b \leq 0.10$, and the well layer 120A comprises $In_cGa_{1-c}N$ wherein $c>0.05$ and $c>2\cdot b$. In certain embodiments, the barrier layer 118A comprises $Al_aIn_bGa_{1-a-b}N$ wherein $0 \leq a \leq 0.50$ and $0 \leq b \leq 0.08$, and the well layer 120A comprises $In_cGa_{1-c}N$ wherein $c>0.08$ and $c>2\cdot b$. In certain embodiments, $b<0.03$. In certain embodiments, $a=0$ and $b=0$. In certain embodiments, the well layer 120A comprises InGaN, and wherein indium is present in a range of from 12% to about 20% of metal in the compound. In certain embodiments, the barrier layer 118A comprises GaN.

FIG. 3B illustrates the barrier-well unit 122B of a second type that may be provided in a quantity of one or more, optionally in conjunction with at least one barrier-well unit of another type (such as the barrier-well units 122A, 122C, and/or 122D described herein), in an active region of an LED structure according to certain embodiments. The barrier-well unit 122B includes a barrier layer 118B arranged in contact with a well layer 120B, with an interface layer 121B arranged in contact with the well layer 120B. In certain embodiments, materials and thicknesses of the well layer 120B and the barrier layer 118B may be substantially similar to or the same as the well layer 120A and the barrier layer 118A of FIG. 3A. In other embodiments, materials and/or thicknesses of barrier layers and/or well layers may differ among different barrier-well units in the active region of a single LED. In certain embodiments, the interface layer 121B comprises a thickness in a range of no greater than one or more of the following thresholds: 12 Å, 10 Å, 8 Å, 7 Å, 6 Å, 5 Å, 4 Å, 3 Å, 2 Å (optionally bounded by a minimum thickness of about 1 Å, about 2 Å, about 3 Å, about 4 Å, about 5 Å, or about 6 Å), no greater than 30% of the thickness of the well layer 120B, no greater than 25% of the thickness well layer 120B, no greater than 20% of the thickness of the well layer 120B, no greater than 15% of the thickness of the well layer 120B, and no greater than 10% of the thickness of the well layer 120B.

In certain embodiments, aluminum is present in greater concentration than indium in the interface layer 121B (if indium is present at all), but at a lower concentration than aluminum of a barrier layer of another barrier-well unit (not shown) that may overlie the barrier-well unit 122B. Without being bound by any particular theory of operation, it is believed that the presence of aluminum in the interface layer 121B at an intermediate concentration relative to the well layer 120B and an overlying barrier layer of an adjacent barrier-well unit (not shown) may reduce strain during growth of the overlying barrier layer, thereby enhancing crystal quality. In certain embodiments, the barrier layer 118B comprises $Al_aIn_bGa_{1-a-b}N$ wherein $0 \leq a \leq 0.50$ and $0 \leq b \leq 0.10$ or $0 \leq b \leq 0.08$, the well layer 120B comprises $In_cGa_{1-c}N$ wherein $c>0.10$ or $c>0.08$ and $c>2\cdot b$, and the interface layer 121B comprises $Al_dGa_{1-d}N$, wherein $0<d \leq 0.30$ (or $0.05<d \leq 0.30$). In certain embodiments, d satisfies one of the following thresholds: $0.01<d<0.3$, $0.01<d<0.25$, $0.05<d<0.3$, $0.1<d<0.3$, $0.15<d<0.3$, and $0.15<d<0.25$. In certain embodiments, $0.01<b<0.10$. In certain embodiments, $a=0$ and $b=0$. In certain embodiments, the interface layer 121B comprises $Al_eIn_fGa_{1-e-f}N$ wherein $e>0$ and wherein $e \geq f$. In certain embodiments, $0<e \leq 0.30$ (or $0.05<e \leq 0.30$). In certain embodiments, e satisfies one of the following thresholds: $0.01<e<0.3$, $0.01<e<0.25$, $0.05<e<0.3$, $0.1<e<0.3$, $0.15<e<0.3$, and $0.15<e<0.25$. In certain embodiments, $f=0$.

FIG. 3C illustrates the barrier-well unit 122C of a third type that may be provided in a quantity of one or more, optionally in conjunction with at least one barrier-well unit of another type (such as the barrier-well units 122A, 122B, and/or 122D described herein), in an active region of an LED structure according to certain embodiments. The barrier-well unit 122C includes an interface layer 119C arranged between and in contact with a barrier layer 118C and a well layer 120C. In certain embodiments, materials and thicknesses of the well layer 120C and the barrier layer 118C may be substantially similar to or the same as the well layer 120A and the barrier layer 118A of FIG. 3A. In certain embodiments, the interface layer 119C comprises a thickness in a range of no greater than one or more of the following thresholds: 12 Å, 10 Å, 8 Å, 7 Å, 6 Å, 5 Å, 4 Å, 3 Å, 2 Å, 30% of the thickness of the well layer 120C, 25% of the thickness of the well layer 120C, 20% of the thickness of the well layer 120C, 15% of the thickness of the well layer 120C, and 10% of the thickness of the well layer 120C.

In certain embodiments, indium is present in greater concentration than aluminum in the interface layer 119C (if indium is present at all), but at a lower concentration than indium present in the well layer 120C. Without being bound by any particular theory of operation, it is believed that the presence of indium in the interface layer 119C at an intermediate concentration relative to the well layer 120C and the barrier layer 118C may reduce strain during growth of the well layer 120C, thereby enhancing crystal quality. In certain embodiments, the barrier layer 118C comprises $Al_{a1}In_{b1}Ga_{1-a1-b1}N$ wherein $0 \leq a1 \leq 0.50$ and $0 \leq b1 \leq 0.10$ or $0 \leq b1 \leq 0.08$, the interface layer 119C comprises $In_{d1}Ga_{1-d1}N$ wherein $0<d1 \leq 0.10$ (or $\leq 0.05$) and $d1<b1$, and the well layer 120C comprises $In_{c1}Ga_{1-c1}N$ wherein $c1>0.10$ or $c1>0.08$ and $c1>2\cdot b1$. In certain embodiments, d1 satisfies one of the following thresholds: $0.01<d1<0.10$, $0.01<d1<0.08$, $0.01<d1<0.06$, $0.01<d1<0.04$, $0.01<d1<0.03$, and $0.01<d1<0.02$.

FIG. 3D illustrates the barrier-well unit 122D of a fourth type that may be provided in a quantity of one or more, optionally in conjunction with at least one barrier-well unit of another type (such as the barrier-well units 122A, 122B, and/or 122C described herein), in an active region of an LED structure according to certain embodiments. The barrier-well unit 122D includes a barrier layer 118D, a well layer 120D, a first interface layer 119D arranged between and in contact with the barrier layer 118D and the well layer 120D, and a second interface layer 121D overlying and arranged in contact with the well layer 120D. In certain embodiments, the materials and thicknesses of the well layer 120D and barrier layer 118D may be substantially similar to or the same as the well layer 120A and barrier layer 118A of FIG. 3A. In certain embodiments, the materials and thicknesses of the first interface layer 119D and the second interface layer 121D may be substantially similar to or the same as the interface layer 119C of FIG. 3C and the interface layer 121B of FIG. 3B, respectively. In certain embodiments, the barrier layer 118D comprises $Al_{a2}In_{b2}Ga_{1-a2-b2}N$ wherein $0 \le a2 \le 0.50$ and $0 \le b2 \le 0.10$ or $0 \le b2 \le 0.08$, the first interface layer 119D comprises $In_{d2}Ga_{1-d2}N$ wherein $0 < d2 \le 0.10$ (or $d2 \le 0.05$, or $0.01 \le d2 \le 0.1$) and $d2 < b2$, the well layer 120D comprises $In_{c2}Ga_{1-c2}N$ wherein $c2 > 0.10$ or $c2 > 0.08$ and $c2 > 2 \cdot b2$, and the second interface layer 121D comprises $Al_{d3}Ga_{1-d3}N$ wherein $0 < d3 \le 0.3$. In certain embodiments, $0.05 < d3 \le 0.3$, and $0.15 < d3 \le 0.25$. In certain embodiments, $b2 < 0.03$. In certain embodiments, $a2=0$ and/or $b2=0$.

Although the barrier-well units 122A-122D illustrated in FIGS. 3A-3D each embody a well layer overlying a barrier layer (e.g., the well layers 120A-120D overlying the barrier layers 118A-118D, respectively), with interface layers overlying well layers and/or barrier layers, it is to be appreciated that in certain embodiments, a barrier-well unit may include a barrier layer overlying a well layer, and/or one or more interface layers underlying a respective barrier layer or well layer. It is therefore contemplated that, according to certain embodiments, the barrier-well unit 122A of FIG. 3A may encompass a reverse structure including a barrier layer 118A overlying a well layer 120A; the barrier-well unit 122B of FIG. 3B may encompass a reverse structure including a barrier layer 118B overlying a well layer 120B with the interface layer 121B arranged at either (i.e., upper or lower) end of the barrier-well unit 122B; the barrier-well unit 122C of FIG. 3C may encompass a reverse structure including a barrier layer 118C overlying a well layer 120C with an intermediately arranged interface layer 119C; and the barrier-well unit 122D of FIG. 3D may encompass a reverse structure including barrier layer 118D overlying a well layer 120D with an intermediately arranged first interface layer 119D, and with a second interface layer 121D arranged at either (i.e., upper or lower) end of the barrier-well unit 122D.

In certain embodiments, an $Al_eIn_fGa_{1-e-f}N$ interface layer (wherein $f > 0$ and $f \ge e$, including but not limited to InGaN) may be provided below a well layer of a barrier-well unit. In certain embodiments, an $Al_eIn_fGa_{1-e-f}N$ interface layer (wherein $f > 0$ and $f \ge e$, including but not limited to InGaN) may be provided above a well layer of a barrier-well unit. In certain embodiments, $Al_eIn_fGa_{1-e-f}N$ interface layers (wherein $f > 0$ and $f \ge e$, including but not limited to InGaN) may be provided above and below a well layer of a barrier-well unit.

In certain embodiments, an $Al_eIn_fGa_{1-e-f}N$ interface layer (wherein $e > 0$ and $e \ge f$, including but not limited to AlGaN) may be provided above a well layer of a barrier-well unit. In certain embodiments, an $Al_eIn_fGa_{1-e-f}N$ interface layer (wherein $e > 0$ and $e \ge f$, including but not limited to AlGaN) may be provided below a well layer of a barrier-well unit. In certain embodiments, $Al_eIn_fGa_{1-e-f}N$ interface layers (wherein $e > 0$ and $e \ge f$, including but not limited to AlGaN) may be provided above and below a well layer of a barrier-well unit.

In certain embodiments, an $Al_eIn_fGa_{1-e-f}N$ interface layer (wherein $e > 0$ and $e \ge f$, including but not limited to AlGaN) may be provided below a well layer, and an $Al_eIn_fGa_{1-e-f}N$ interface layer (wherein $d > 0$ and $d$ e, including but not limited to InGaN) may be provided above a well layer, of a barrier-well unit. In certain embodiments, an $Al_eIn_fGa_{1-e-f}N$ interface layer (wherein $e > 0$ and $e \ge f$, including but not limited to AlGaN) may be provided above a well layer, and an $Al_eIn_fGa_{1-e-f}N$ interface layer (wherein $f > 0$ and $f \ge e$, including but not limited to InGaN) may be provided below a well layer, of a barrier-well unit.

In certain embodiments, active regions as described herein may comprise barrier-well units with barrier layers that include n-type dopants. N-type dopants in the barrier layers may improve the conductivity of the barrier layers, which in turn may reduce a forward voltage of an LED structure. However, if an n-type doping concentration is too high, then the crystal quality of the barrier layers and subsequent well layers may decrease. In that regard, doping profiles of the active regions may be configured such that a doping concentration in some barrier-well units is different than a doping concentration in other barrier-well units. For example, an active region may comprise a plurality of sequentially arranged barrier-well units, and a first barrier-well unit comprises a barrier layer with higher n-type doping concentration than the remaining barrier layers of the other barrier-well units.

Figure 4:
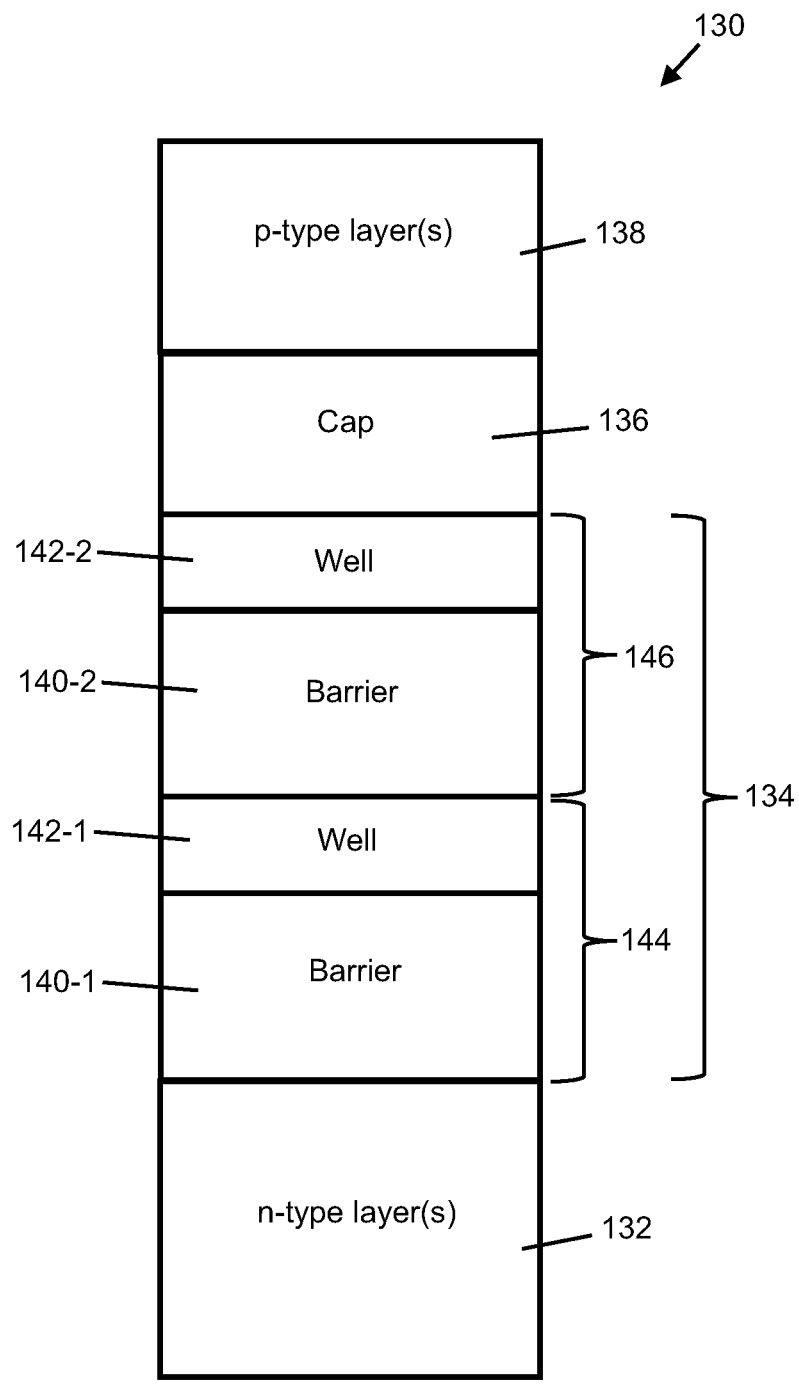
FIG. 4 is a side cross-sectional schematic view of a portion of an LED structure according to embodiments disclosed herein.

FIG. 4 is a side cross-sectional schematic view of a portion of an LED structure 130 according to embodiments disclosed herein. The LED structure 130 includes one or more n-type layers 132, an active region 134, a cap layer 136, and one or more p-type layers 138. In certain embodiments, the active region 134 and the cap layer 136 may be utilized as the active region 17 and the cap layer 25 respectively of FIG. 1. The active region 134 includes a plurality of $Al_aIn_bGa_{1-a-b}N$ barrier layers 140-1, 140-2 and a plurality of $In_{c1}Ga_{1-c1}N$ well layers 142-1, 142-2, with compositions as previously described. The plurality of $Al_aIn_bGa_{1-a-b}N$ barrier layers 140-1, 140-2 and the plurality of $In_{c1}Ga_{1-c1}N$ well layers 142-1, 142-2 may be grown using ammonia as a source gas together with one or more carrier gases such as $H_2$, $N_2$, inert gases, and/or mixtures thereof. The particular carrier gas or carrier gas mixture may be the same during growth of the entire active region 134, or it may differ for different layers of the active region 134. In certain embodiments, the one or more carrier gases used during growth of the plurality of $Al_aIn_bGa_{1-a-b}N$ barrier layers 140-1, 140-2 may include at least one of $H_2$, $N_2$, inert gases, and/or mixtures thereof, and the one or more carrier gases used during growth of the plurality of $In_{c1}Ga_{1-c1}N$ well layers 142-1, 142-2 includes a different one of $H_2$, $N_2$, inert gases, and/or mixtures thereof. Individual pairs of the plurality of $Al_aIn_bGa_{1-a-b}N$ barrier layers 140-1, 140-2 and the plurality of $In_{c1}Ga_{1-c1}N$ well layers 142-1, 142-2 form a plurality of sequentially arranged barrier-well units. For example, barrier layer 140-1 and well layer 142-1 form a first barrier-well unit 144 and barrier layer 140-2 and well layer 142-2 form a second barrier-well unit 146. In certain embodiments, the first barrier-well unit 144 comprises a different composition, a different layer structure, and/or a different doping profile than the second barrier-well unit 146. In this manner, different barrier-well units may be repeated independently of each other to achieve different structures of the active region 134. The active region 134 may include any number of sequentially arranged barrier-well units 144, 146. In certain embodiments, the active region 134 includes at least five sequentially arranged barrier-well units 144, 146, or at least eight sequentially arranged barrier-well units 144, 146, or at least ten sequentially arranged barrier-well units 144, 146.

In certain embodiments, the $Al_aIn_bGa_{1-a-b}N$ barrier layer 140-1 of the first barrier-well unit 144 comprises a higher n-type doping concentration than an n-type doping concentration of the $Al_aIn_bGa_{1-a-b}N$ barrier layer 140-2 of the second barrier-well unit 146. Additionally, the n-type doping concentration of the $Al_aIn_bGa_{1-a-b}N$ barrier layer 140-1 may be intermediate the n-type doping concentrations present in the one or more n-type layers 132 and the n-type doping concentration of the $Al_aIn_bGa_{1-a-b}N$ barrier layer 140-2. In this regard, the n-type doping profile of the LED structure 130 is stepped or graded down in a controlled manner from the higher concentrations found in the one or more n-type layers 132 toward the one or more p-type layers 138. In certain embodiments, the active region 134 includes the first barrier-well unit 144 and a plurality of second barrier-well units 146. Accordingly, in certain embodiments, the $Al_aIn_bGa_{1-a-b}N$ barrier layer 140-1 of the first barrier-well unit 144 comprises a higher n-type doping concentration than an n-type doping concentration of each $Al_aIn_bGa_{1-a-b}N$ barrier layer 140-2 of the plurality of second barrier-well units 146. As illustrated in FIG. 4, the first barrier-well unit 144 is arranged between the one or more n-type layers 132 and the plurality of second barrier-well units 146. The one or more n-type layers 132 may include the following: a second nitride layer (14 of FIG. 1) including an n-GaN layer as previously described; a spacer layer (15 of FIG. 1) including a first sublayer and a second sublayer as previously described; and a superlattice structure (16 of FIG. 1) as previously described. In this manner, the LED structure 130 may include the following sequence: the first barrier-well unit 144 is arranged between the second nitride layer (14 of FIG. 1) and the plurality of second barrier-well units 146; the spacer layer (15 of FIG. 1) is arranged between the second nitride layer (14 of FIG. 1) and the first barrier-well unit 144; and the superlattice structure (16 of FIG. 1) is arranged between the spacer layer (15 of FIG. 1) and the first barrier-well unit 144.

As described above, in certain embodiments, the $Al_aIn_bGa_{1-a-b}N$ barrier layer 140-1 of the first barrier-well unit 144 comprises a higher n-type doping concentration than an n-type doping concentration of each $Al_aIn_bGa_{1-a-b}N$ barrier layer 140-2 of the plurality of second barrier-well units 146. For example, in certain embodiments, the n-type doping concentration of the $Al_aIn_bGa_{1-a-b}N$ barrier layer 140-1 of the first barrier-well unit 144 is in a range of about $1 \times 10^{17}$ cm$^{-3}$ to about $3 \times 10^{17}$ cm$^{-3}$ and the n-type doping concentration of each $Al_aIn_bGa_{1-a-b}N$ barrier layer 140-2 of the plurality of second barrier-well units 146 is in a range of about $6 \times 10^{16}$ cm$^{-3}$ to about $8 \times 10^{16}$ cm$^{-3}$. In certain embodiments, the $Al_aIn_bGa_{1-a-b}N$ barrier layer 140-1 of the first barrier-well unit 144 comprises an n-type doping concentration that is at least two times higher than an n-type doping concentration of each $Al_aIn_bGa_{1-a-b}N$ barrier layer 140-2 of the plurality of second barrier-well units 146. In other embodiments, the $Al_aIn_bGa_{1-a-b}N$ barrier layer 140-1 of the first barrier-well unit 144 comprises an n-type doping concentration that is at least five times higher than an n-type doping concentration of each $Al_aIn_bGa_{1-a-b}N$ barrier layer 140-2 of the plurality of second barrier-well units 146. In still other embodiments, the $Al_aIn_bGa_{1-a-b}N$ barrier layer 140-1 of the first barrier-well unit 144 comprises an n-type doping concentration within a range of from (i) at least two times higher than an n-type doping concentration of each $Al_aIn_bGa_{1-a-b}N$ barrier 140-2 layer of the plurality of second barrier-well units 146 to (ii) no more than ten times higher than an n-type doping concentration of each $Al_aIn_bGa_{1-a-b}N$ barrier layer 140-2 of the plurality of second barrier-well units 146. In certain embodiments, the $Al_aIn_bGa_{1-a-b}N$ barrier layer of the first barrier-well unit comprises an n-type doping concentration of no more than one hundred times higher than an n-type doping concentration of each $Al_aIn_bGa_{1-a-b}N$ barrier layer of the plurality of second barrier-well units.

As previously described, active regions as described herein may comprise barrier-well units with barrier layers that include n-type dopants. N-type dopants in the barrier layers may improve the conductivity of the barrier layers, which in turn may reduce the forward voltage of an LED structure. However, if the n-type doping concentration is too high, then the crystal quality of the barrier layers and subsequent well layers may decrease. In that regard, doping profiles of the active regions may be configured such that a doping concentration in at least one barrier-well unit is non-uniform. For example, the maximum dopant concentration within the barrier layer may be located between an upper boundary and a lower boundary of the barrier layer. In certain embodiments, each barrier-well unit may have the same non-uniform doping profile. In other embodiments, one or more barrier-well units may have a different non-uniform profile than other barrier-well units. In still other embodiments, one or more barrier-well units may have a non-uniform profile and other barrier-well units may have a uniform doping profile.

FIG. 5A is a side cross-sectional schematic view of a barrier layer 148 of a barrier-well unit according to certain embodiments disclosed herein, and FIGS. 5B-5F illustrate various non-uniform doping profiles that may be employed within the barrier layer 148 of FIG. 5A. In FIG. 5A, the barrier layer 148 comprises a lower boundary 150, an upper boundary 152, and a thickness extending between the lower boundary 150 and the upper boundary 152. The thickness is divisible into a lower third 156 proximate to the lower boundary 150, an upper third 158 proximate to the upper boundary 152, and a middle third 160 arranged between the lower third 156 and the upper third 158. FIGS. 5B-5F show n-type dopant concentrations 154-1 to 154-5 that are non-uniform between the upper boundary 152 and the lower boundary 150. In certain embodiments, a carrier concentration of the n-type dopant is within a range of 1E+16 and 1E+18 atoms per cubic centimeter. In further embodiments, the carrier concentration of the n-type dopant is within a range of 1E+17 and 3E+17 atoms per cubic centimeter. The n-type dopant concentrations 154-1 to 154-5 of the barrier layer 148 may be achieved in a number of ways. For example, during growth of the barrier layer 148, the source gas for the n-type dopant (e.g. silane SiH4 for a Si dopant) may be continuously graded up and then continuously graded down between the lower boundary 150 and the upper boundary 152. In another example, the source gas for the n-type dopant may be turned off during growth of some portions of the barrier layer 148 and turned on during others. The arrows pointing to the right indicate higher dopant concentrations. The barrier layer 148 may be utilized as at least one of the plurality of $Al_aIn_bGa_{1-a-b}N$ barrier layers 140-1, 140-2 of FIG. 4 or as at least one of the barrier layers of embodiments described below.

In FIG. 5B, a relative doping profile from the lower boundary 150 to the upper boundary 152 for a first n-type dopant concentration 154-1 is illustrated. For the first n-type dopant concentration 154-1, a maximum n-type dopant concentration 162 is between the upper boundary 152 and the lower boundary 150. In this manner, the maximum n-type dopant concentration 162 is spaced from a subsequent well layer that is on the barrier layer 148. The maximum n-type dopant concentration 162 for the dopant concentration 154-1 is located within the middle third 160.

In FIG. 5C, a second n-type dopant concentration 154-2 includes a maximum n-type dopant concentration 164 that is located within the lower third 156. In this manner, the maximum n-type dopant concentration 164 is also spaced from a subsequent well layer that is on the barrier layer 148. In FIG. 5D, a third n-type dopant concentration 154-3 includes a maximum n-type dopant concentration 165 that is located within the upper third 158. In this manner, the maximum n-type dopant concentration 165 is also spaced further from a previous well layer that the barrier layer 148 is on. Accordingly, a location of a maximum n-type dopant concentration may be in different locations for different embodiments. Configuring the maximum n-type dopant concentration in different locations within a barrier layer may change the position of a local junction within a particular well-barrier unit and position a local recombination zone closer to or farther away from a particular well of a well-barrier unit. Accordingly, a conduction band and a carrier density of a barrier layer may be configured to be non-uniform. This may allow the ability to precisely control electrical performance of the overall structure, including high current and high temperature performance. As illustrated in FIGS. 5B to 5D, in certain embodiments, the barrier layer 148 may have an n-type dopant concentration 154-1 to 154-3 that increases and decreases in a linear manner to and from the maximum n-type dopant concentration 162, 164, 165. In FIGS. 5E and 5F, a relative doping profile from the lower boundary 150 to the upper boundary 152 for configurations of fourth and fifth n-type dopant concentrations 154-4, 154-5 are illustrated. Rather than the linear profiles of FIGS. 5B to 5D, the n-type dopant concentrations 154-4, 154-5 have profiles that are curved. For the fourth n-type dopant concentration 154-4 of FIG. 5E, the profile is curved to a maximum n-type dopant concentration 166 that is located within the middle third 160. In a similar manner, the profile of the fifth n-type dopant concentration 154-5 of FIG. 5F curves to a maximum n-type dopant concentration 168 that is located within the middle third 160. However, the fifth n-type dopant concentration 154-5 includes a sharper or narrower curve to the maximum n-type dopant concentration 168 such that the lower third 156 and the upper third 158 have even lower average dopant concentrations. In this manner, the maximum n-type dopant concentration 168 is spaced from a well layer on either the upper boundary 152 or the lower boundary 150 of the barrier layer 148 by the lower average dopant concentrations.

Figure 5G:
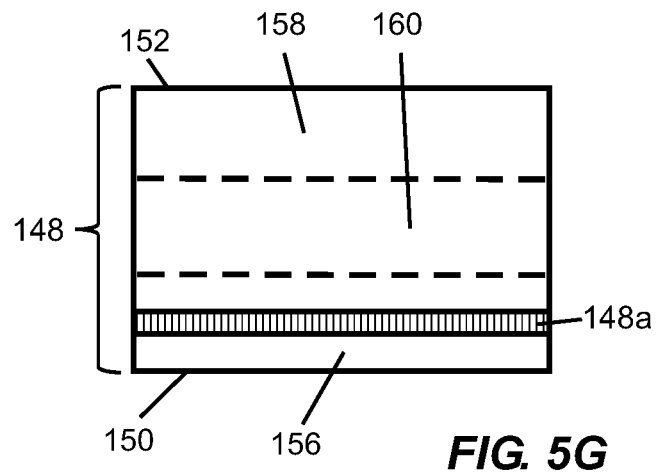
FIGS. 5G-5I are side cross-sectional schematic views of barrier layers of barrier-well units according to certain embodiments disclosed herein.
Figure 5H:
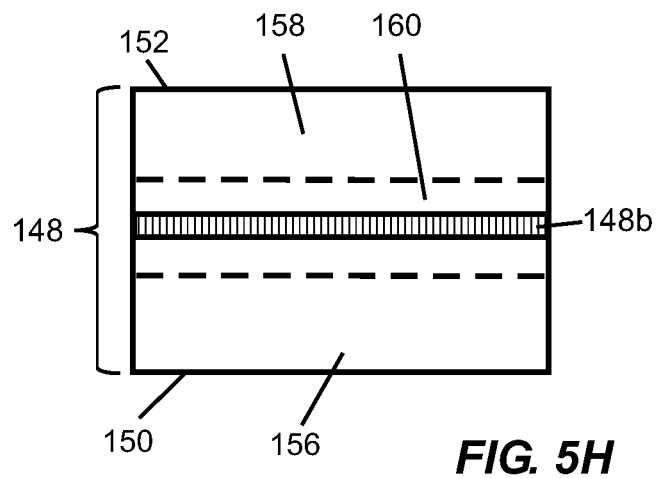
Figure 5I:
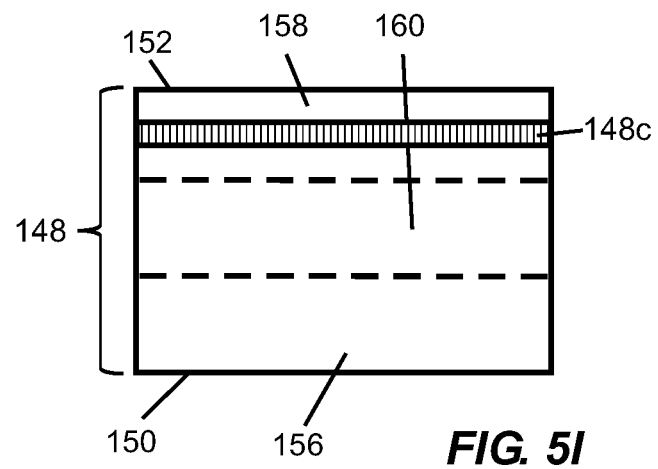

As previously described, the n-type dopant concentrations 154-1 to 154-5 of the barrier layer 148 may be achieved in a number of ways. For example, the source gas for the n-type dopant may be turned off during growth of some portions of the barrier layer 148 and turned on during others. FIGS. 5G-5I are side cross-sectional schematic views of the representative barrier layer 148 according to certain embodiments disclosed herein. In each of the FIGS. 5G-5I, the barrier layer 148 comprises the lower boundary 150, the upper boundary 152, the lower third 156 proximate to the lower boundary 150, the upper third 158 proximate to the upper boundary 152, and the middle third 160 arranged between the lower third 156 and the upper third 158 as previously described. In FIG. 5G, the source gas for the n-type dopant is only turned on during growth of the lower third 156 of the barrier layer 148. In certain embodiments, a barrier sublayer 148a is formed within the lower third 156. Depending on how long the source gas for the n-type dopant is left on, the barrier sublayer 148a may have different thicknesses within the lower third 156. As illustrated in FIG. 5G, the barrier sublayer 148a is configured in a portion of, but not all of the lower third 156. In other embodiments, the barrier sublayer 148a may extend for the entire thickness of the lower third 156. In FIG. 5H, a barrier sublayer 148b is configured in the middle third 160 in a similar manner as the barrier sublayer 148a of FIG. 5G. In FIG. 5I, a barrier sublayer 148c is configured in the upper third 158 in a similar manner as the barrier sublayer 148a of FIG. 5G. In certain embodiments, the barrier sublayers 148a-c may comprise a discreet discrete layer of material that has the same composition as the rest of the barrier layer 148, but further comprises a higher n-type doping concentration. In other embodiments, the barrier sublayers 148a-c may comprise delta-doped layers, such as thin layers with higher n-type doping concentrations. In some embodiments, a delta-doped layer is formed by turning off other source gases (e.g. Al, Ga, In) and leaving on the dopant source gas (e.g. Si) for a brief period of time. In certain embodiments, the barrier layer 148 may comprise only one of the barrier sublayers 148a-c. In other embodiments, the barrier layer 148 may comprise all of the barrier sublayers 148a-c, or different combinations of barrier sublayers 148a-c.

Figure 6:
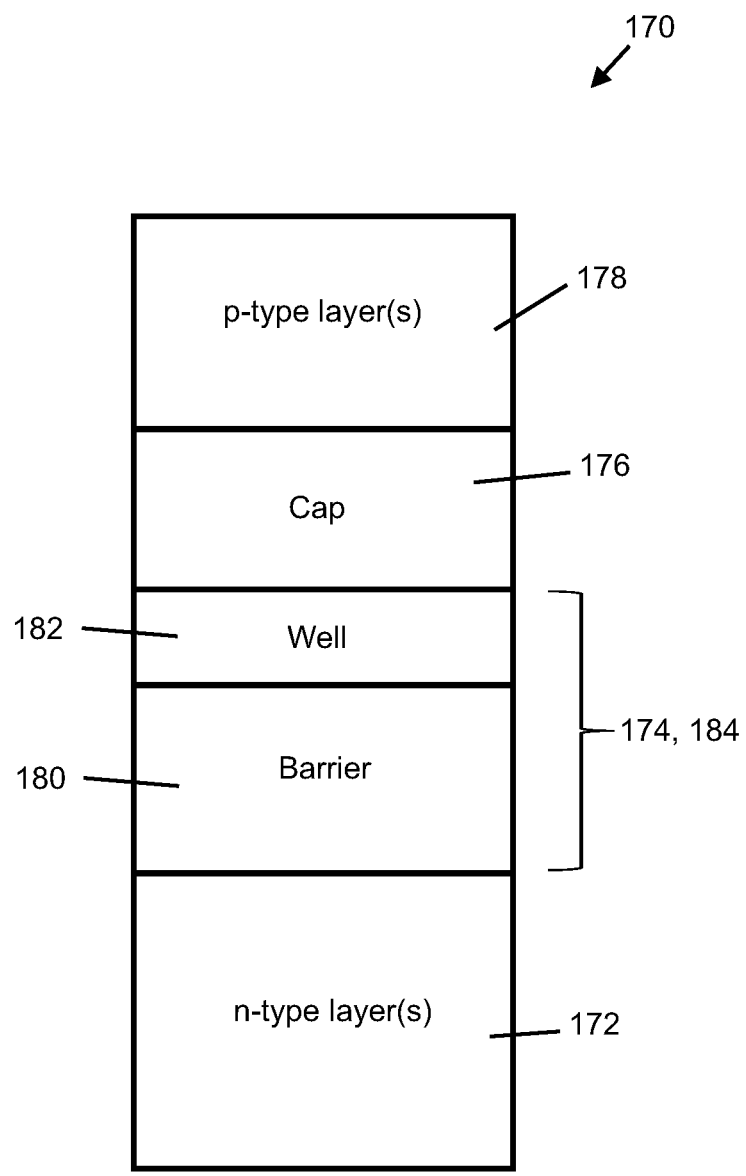
FIG. 6 is a side cross-sectional schematic view of a portion of an LED structure according to embodiments disclosed herein.

FIG. 6 is a side cross-sectional schematic view of a portion of an LED structure 170 according to embodiments disclosed herein. The LED structure 170 includes one or more n-type layers 172, an active region 174, a cap layer 176, and one or more p-type layers 178 as previously described. In certain embodiments, the active region 174 and the cap layer 176 may be utilized as the active region 17 and the cap layer 25 respectively of FIG. 1. The active region 174 includes an $Al_aIn_bGa_{1-a-b}N$ barrier layer 180 and an $In_{c1}Ga_{1-c1}N$ well layer 182 with compositions as previously described. The $Al_aIn_bGa_{1-a-b}N$ barrier layer 180 and the $In_{c1}Ga_{1-c1}N$ well layer 182 form a barrier-well unit 184. In certain embodiments, the barrier-well unit 184 may be repeated a number of times to form a plurality of sequentially arranged barrier-well units 184 that form the active region 174. For simplicity, the active region 174 and the barrier-well unit 184 are illustrated with the same bracket in FIG. 6. It is understood for embodiments that include a plurality of sequentially arranged barrier-well units 184, the active region 174 would encompass all of the sequentially arranged barrier-well units 184. In certain embodiments, the active region 174 includes at least five sequentially arranged barrier-well units 184, or at least eight sequentially arranged barrier-well units 184, or at least ten sequentially arranged barrier-well units 184. In certain embodiments, the $Al_aIn_bGa_{1-a-b}N$ barrier layer 180 comprises an n-type dopant as previously described. In this regard, for embodiments that include a plurality of sequentially arranged barrier-well units 184, each barrier layer 180 of the plurality of sequentially arranged barrier-well units 184 comprises the same n-type doping concentration or the same n-type doping profile. In certain embodiments, each barrier layer 180 of the plurality of sequentially arranged barrier-well units 184 comprises an n-type dopant concentration that is non-uniform within each barrier layer 180 as described for FIGS. 5A and 5B. Additionally, each barrier-well unit 184 may comprise at least one interface layer as illustrated in FIGS. 3B 3D.

In certain embodiments, active regions as described herein may comprise barrier-well units with barrier layers that include n-type dopants and interface layers. In certain embodiments, doping profiles of the active regions may be configured such that a doping concentration in some barrier-well units is different than a doping concentration in other barrier-well units. For example, an active region may comprise a plurality sequentially arranged barrier-well units, and a first barrier-well unit comprises a barrier layer with a higher n-type doping concentration than the remaining barrier layers of the other barrier-well units. In certain embodiments, at least one barrier layer may comprise an n-type doping concentration that is non-uniform between an upper boundary and a lower boundary of the barrier layer. In certain embodiments, interface layers embody thin layers (e.g., preferably less than or no greater than 10 Å thick) with a thickness less than (or no greater than) 5 Å, less than (or no greater than) 4 Å, or another thickness threshold disclosed herein, and/or preferably a thickness of no greater than about 30% of a thickness of an adjacent well layer of various compositions.

Figure 7:
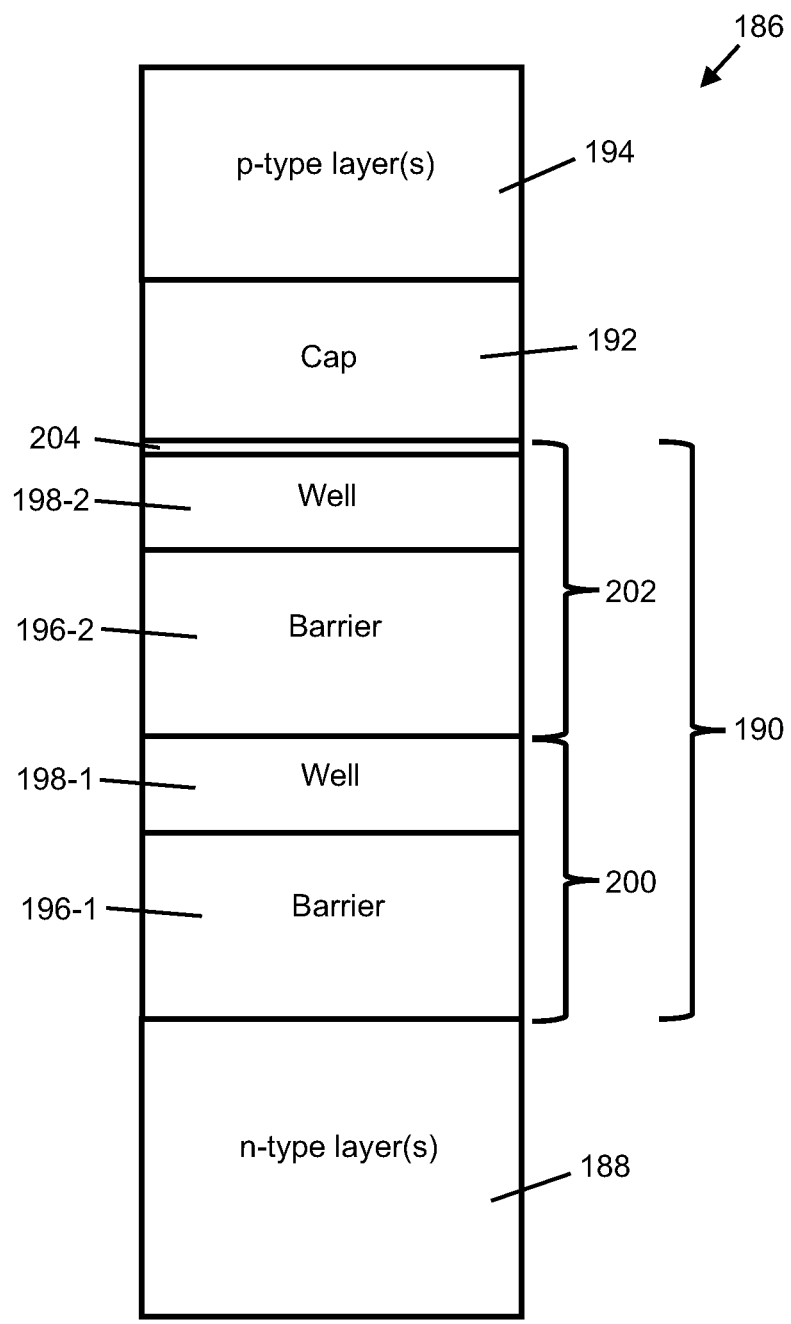
FIG. 7 is a side cross-sectional schematic view of a portion of an LED structure according to embodiments disclosed herein.

FIG. 7 is a side cross-sectional schematic view of a portion of an LED structure 186 according to embodiments disclosed herein. The LED structure 186 includes one or more n-type layers 188, an active region 190, a cap layer 192, and one or more p-type layers 194 as previously described. In certain embodiments, the active region 190 and the cap layer 192 may be utilized as the active region 17 and the cap layer 25 respectively of FIG. 1. The active region 190 includes a plurality of $Al_aIn_bGa_{1-a-b}N$ barrier layers 196-1, 196-2 and a plurality of $In_{c1}Ga_{1-c1}N$ well layers 198-1, 198-2 with compositions as previously described. Individual pairs of the plurality of $Al_aIn_bGa_{1-a-b}N$ barrier layers 196-1, 196-2 and the plurality of $In_{c1}Ga_{1-c1}N$ well layers 198-1, 198-2 form a plurality of sequentially arranged barrier-well units 200, 202. For example, the barrier layer 196-1 and the well layer 198-1 form a first barrier-well unit 200, and the barrier layer 196-2 and the well layer 198-2 form a second barrier-well unit 202. In certain embodiments, the first barrier-well unit 200 comprises a different composition, a different layer structure, and/or a different doping profile than the second barrier-well unit 202. In this manner, different barrier-well units 200, 202 may be repeated independently of each other to achieve different structures of the active region 190. In certain embodiments, the second barrier-well unit 202 comprises an $Al_dIn_eGa_{1-d-e}N$ interface layer 204 (wherein d>0 and wherein d e) as previously described. Accordingly, the LED structure 186 may comprise the active region 190 that includes at least one barrier-well unit 202, but fewer than all barrier-well units, of the plurality of sequentially arranged barrier-well units 200, 202, that additionally comprises the $Al_dIn_eGa_{1-d-e}N$ interface layer 204. In certain embodiments, the active region 190 may include any of the barrier-well unit configurations described for FIGS. 3A to 3D.

The active region 190 may include any number of sequentially arranged barrier-well units 200, 202. In certain embodiments, the active region 190 includes at least five sequentially arranged barrier-well units 200, 202, or at least eight sequentially arranged barrier-well units 200, 202, or at least ten sequentially arranged barrier-well units 200, 202. The number of times a particular barrier-well unit 200, 202 repeats may be the same as the other barrier-well unit 200, 202 or different. For example, embodiments in which the active region 190 comprises ten sequentially arranged barrier-well units 200, 202 may include, but are not limited to the following: the barrier-well unit 200 and the barrier-well unit 202 each repeat five times; or the barrier-well unit 200 does not repeat and the barrier-well unit 202 repeats nine times. In certain embodiments, the plurality of $Al_aIn_bGa_{1-a-b}N$ barrier layers 196-1, 196-2 additionally comprises an n-type doping concentration. The n-type doping concentration may be the same for each barrier layer of the plurality of barrier layers 196-1, 196-2, or the n-type doping concentration may be different for at least one barrier layer of the plurality of barrier layers 196-1, 196-2. In certain embodiments, at least one barrier layer of the plurality of barrier layers 196-1, 196-2 comprises an n-type doping concentration that is non-uniform between an upper boundary and a lower boundary of the barrier layer 196-1, 196-2 as previously described.

In certain embodiments, certain configurations of one or more capping layers and one or more p-type layers may be arranged on the previously-described active regions to further improve various electrical characteristics, including forward voltage and brightness. In certain embodiments, an LED structure includes a cap layer, a p-type InGaN or a p-type GaN layer, and a p-type AlInGaN layer sequentially arranged on an active region with an n-type concentration as previously described. The LED structure may further comprise the p-type GaN layer on the p-type AlInGaN layer. In certain embodiments, the p-type GaN layer comprises a plurality of sublayers that is configured to vary a p-type doping concentration within the p-type GaN layer. For example, the p-type doping concentration may alternate between lower concentrations and higher concentrations in various sublayers, or the p-type doping concentration may increase or decrease in various sublayers to form a p-type GaN layer with a graded p-type doping profile. The graded p-type doping profile may comprise a linear grade, a curved grade, a stepwise grade, or combinations thereof.

Figure 8:
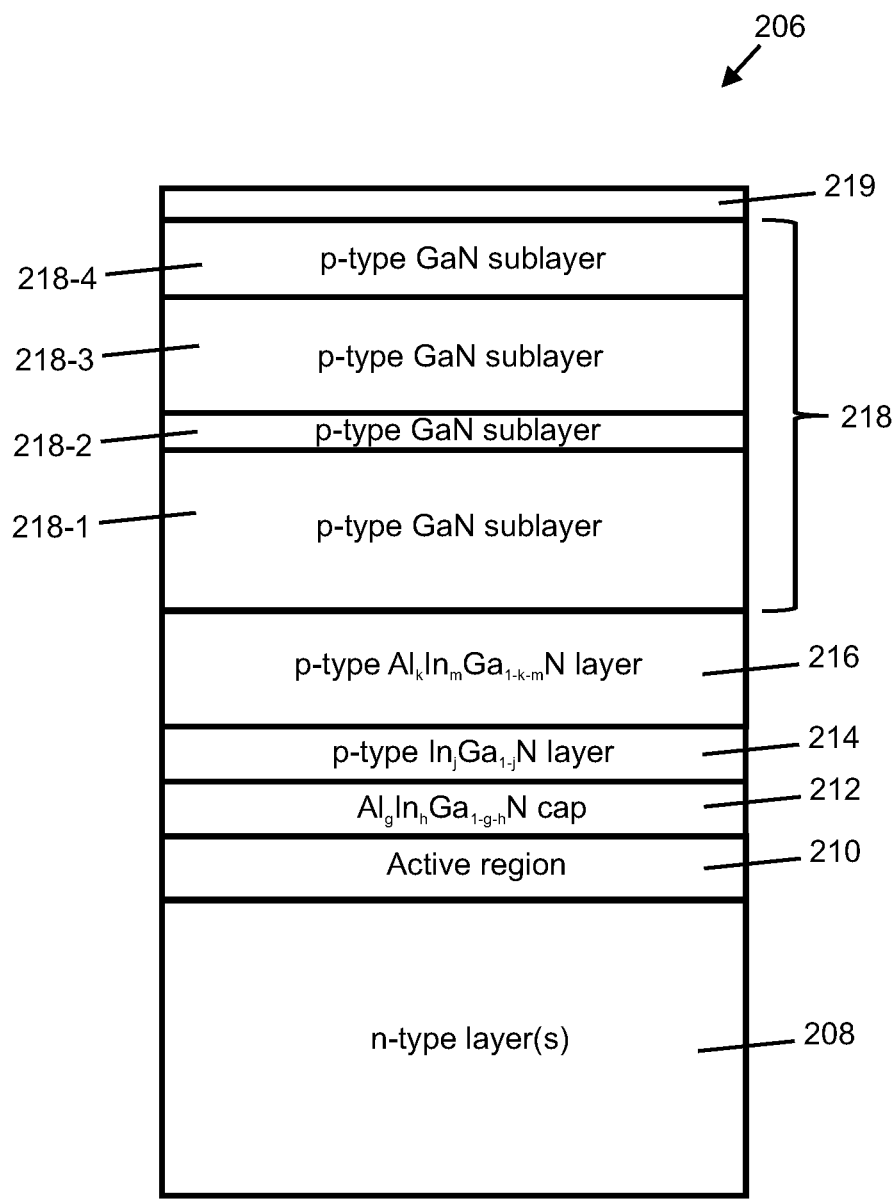
FIG. 8 is a side cross-sectional schematic view of a portion of an LED structure according to embodiments disclosed herein.

FIG. 8 is a side cross-sectional schematic view of a portion of an LED structure 206 according to embodiments disclosed herein. The LED structure 206 includes one or more n-type layers 208, an active region 210, and a cap layer 212 as previously described. In certain embodiments, the cap layer 212 comprises an $Al_gIn_hGa_{1-g-h}N$ cap layer 212 (where 0<g<1, 0≤h<1, and g+h<1). The $Al_gIn_hGa_{1-g-h}N$ cap layer 212 may be undoped as previously described. In certain embodiments, in the $Al_gIn_hGa_{1-g-h}N$ cap layer 212, h=0, 0.04<g≤0.33, and a thickness of the $Al_gIn_hGa_{1-g-h}N$ cap layer 212 is in a range of about 40 Å to about 200 Å. In further embodiments, in the $Al_gIn_hGa_{1-g-h}N$ cap layer 212, h=0, 0.04≤g≤0.08, and a thickness of the $Al_gIn_hGa_{1-g-h}N$ cap layer 212 is in a range of about 40 Å to about 100 Å. The LED structure 206 further includes a p-type $In_jGa_{1-j}N$ layer 214, wherein 0≤j<1, and a thickness of the p-type $In_jGa_{1-j}N$ layer 214 is in a range of about 40 Å to about 100 Å. In some embodiments, for the p-type $In_jGa_{1-j}N$ layer 214, j=0. Additionally, the LED structure 206 includes a p-type $Al_kIn_mGa_{1-k-m}N$ layer 216, wherein 0<k<1, 0≤m<1, and k+m<1, and a thickness of the p-type $Al_kIn_mGa_{1-k-m}N$ layer 216 is in a range of about 150 Å to about 250 Å. In certain embodiments, the $Al_gIn_hGa_{1-g-h}N$ cap layer 212 is arranged between the active region 210 and the p-type $In_jGa_{1-j}N$ layer 214, and the p-type $In_jGa_{1-j}N$ layer 214 is arranged between the $Al_gIn_hGa_{1-g-h}N$ cap layer 212 and the p-type $Al_kIn_mGa_{1-k-m}N$ layer 216. In certain embodiments, the p-type $In_jGa_{1-j}N$ layer 214 comprises p-type InGaN (j>0). The LED structure 206 may additionally comprise a p-type GaN layer 218 arranged such that the p-type $Al_kIn_mGa_{1-k-m}N$ layer 216 is between the p-type $In_jGa_{1-j}N$ layer 214 and the p-type GaN layer 218.

The p-type GaN layer 218 may include a plurality of p-type GaN sublayers 218-1 to 218-4 that is configured to vary a p-type doping concentration within the p-type GaN layer 218. In certain embodiments, the first p-type GaN sublayer 218-1 includes a first p-type doping concentration, the second p-type GaN sublayer 218-2 includes a second p-type doping concentration, the third p-type GaN sublayer 218-3 includes a third p-type doping concentration and the fourth p-type GaN sublayer 218-4 includes a fourth p-type doping concentration. The plurality of p-type GaN sublayers 218-1 to 218-4 allows the p-type GaN layer 218 to be configured with various p-type doping profiles. In certain embodiments, the fourth p-type doping concentration of the fourth p-type GaN sublayer 218-4 is the highest p-type doping concentration for the p-type GaN layer 218. The other p-type GaN sublayers 218-1 to 218-3 may have p-type doping concentrations equal to or lower than the fourth p-type GaN sublayer 218-4. For example, in certain embodiments, the fourth p-type doping concentration is about equal to the second p-type doping concentration, the first p-type doping concentration is in a range of from about 1% to about 20% of the fourth p-type doping concentration, and the third p-type doping concentration is in a range of from about 25% to about 75% of the fourth p-type doping concentration. In further embodiments, the fourth p-type doping concentration is about equal to the second p-type doping concentration, the first p-type doping concentration is in a range of from about 5% to about 15% of the fourth p-type doping concentration, and the third p-type doping concentration is in a range of from about 30% to about 60% of the fourth p-type doping concentration. In certain embodiments, the first p-type doping concentration of the first p-type GaN sublayer 218-1 is in a range of about $8\times10^{18}$ cm$^{-3}$ to about $3\times10^{19}$ cm$^{-3}$; the second p-type doping concentration of the second p-type GaN sublayer 218-2 is in a range of about $1\times10^{20}$ cm$^{-3}$ to about $3\times10^{20}$ cm$^{-3}$; the third p-type doping concentration of the third p-type GaN sublayer 218-3 is in a range of about $8\times10^{19}$ cm$^{-3}$ to about $2\times10^{20}$ cm$^{-3}$; and the fourth p-type doping concentration of the fourth p-type GaN sublayer 218-4 is in a range of about $1\times10^{20}$ cm$^{-3}$ to about $3\times10^{20}$ cm$^{-3}$. In other embodiments, the p-type doping concentration of the p-type GaN layer 218 may sequentially increase or decrease across the plurality of p-type GaN sublayers 218-1 to 218-4. In certain embodiments, thicknesses of each of the p-type GaN sublayers 218-1 to 218-4 may vary. For example, the first p-type GaN sublayer 218-1 may have a thickness in a range of about 400 Å to about 520 Å, the second p-type GaN sublayer 218-2 may have a thickness in a range of about 20 Å to about 30 Å, the third p-type GaN sublayer 218-3 may have a thickness in a range of about 350 Å to about 450 Å, and the fourth p-type GaN sublayer 218-4 may have a thickness in a range of about 110 Å to about 140 Å. The LED structure 206 may additionally comprise a p-type InGaN contact layer 219 that is configured to provide a surface for making an electrical contact to the LED structure 206. In other embodiments, the p-type InGaN contact layer 219 is omitted and the p-type GaN layer 218 functions as a contact layer. In certain embodiments, the cap layer 212, the p-type In$_j$Ga$_{1-j}$N layer 214, the p-type Al$_k$In$_m$Ga$_{1-k-m}$N layer 216, and the p-type GaN layer 218 may be utilized in place of the cap layer 25, the p-type AlGaN layer 30, and the contact layer 32 of FIG. 1.

Figure 9:
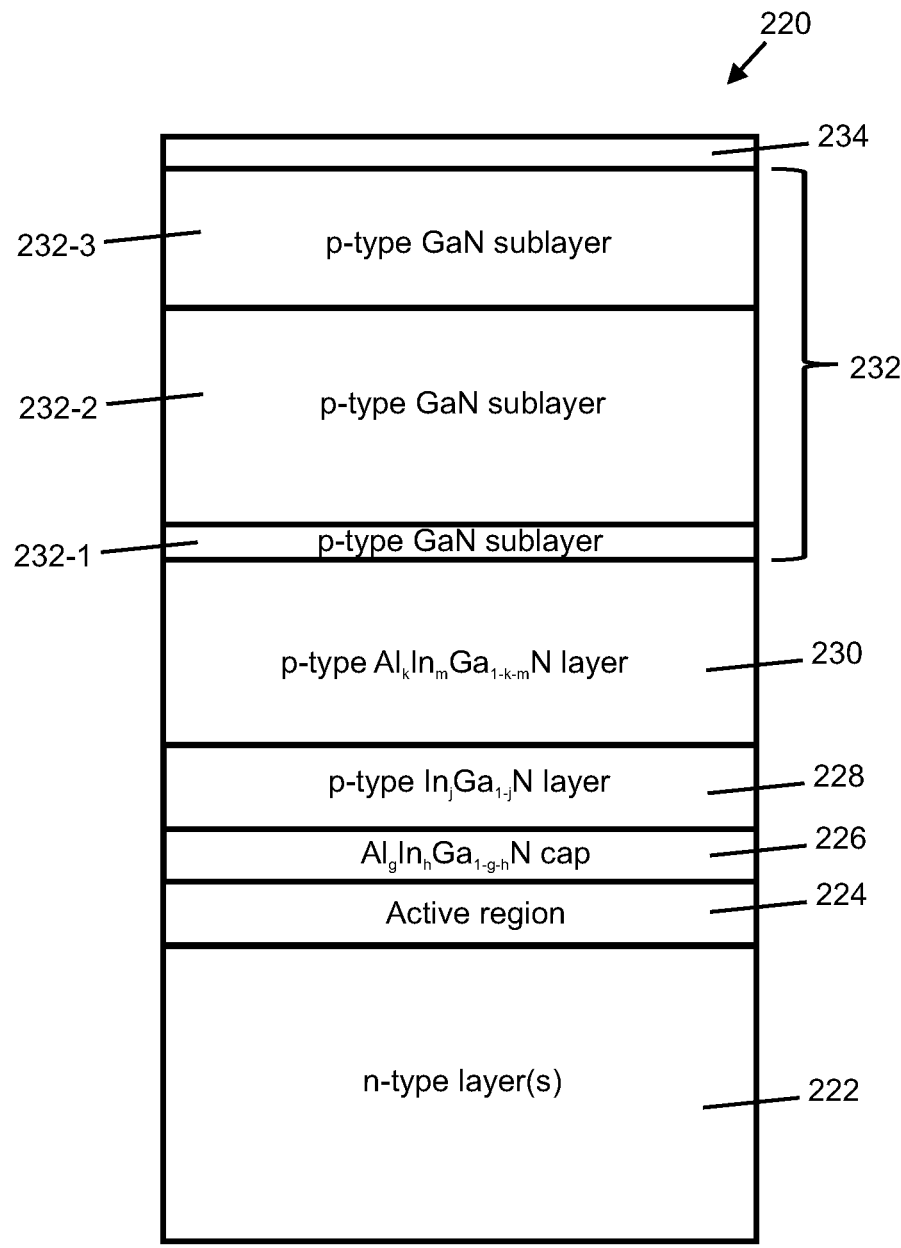
FIG. 9 is a side cross-sectional schematic view of a portion of an LED structure according to embodiments disclosed herein.

FIG. 9 is a side cross-sectional schematic view of a portion of an LED structure 220 according to embodiments disclosed herein. The LED structure 220 includes one or more n-type layers 222, an active region 224, an Al$_g$In$_h$Ga$_{1-g-h}$N cap layer 226, a p-type In$_j$Ga$_{1-j}$N layer 228, a p-type Al$_k$In$_m$Ga$_{1-k-m}$N layer 230, a p-type GaN layer 232, and a p-type InGaN contact layer 234 as previously described. In certain embodiments, for the p-type In$_j$Ga$_{1-j}$N layer 228, $0\leq j<1$. In further embodiments, for the p-type In$_j$Ga$_{1-j}$N layer 228, $0<j<1$. In still further embodiments, for the p-type In$_j$Ga$_{1-j}$N layer 228, $0<j<0.05$. The p-type In$_j$Ga$_{1-j}$N layer 228 may comprise a thickness in a range of 50 Å to about 200 Å. In further embodiments, the p-type In$_j$Ga$_{1-j}$N layer 228 may comprise a thickness in a range of 100 Å to about 150 Å. The p-type GaN layer 232 includes a plurality of p-type GaN sublayers 232-1 to 232-3. In certain embodiments, the first p-type GaN sublayer 232-1 includes a first p-type doping concentration, the second p-type GaN sublayer 232-2 includes a second p-type doping concentration, and the third p-type GaN sublayer 232-3 includes a third p-type doping concentration. In certain embodiments, the first p-type doping concentration and the second p-type doping concentration are in a range of from about 5% to about 35% of the third p-type doping concentration. In further embodiments, the first p-type doping concentration and the second p-type doping concentration are in a range of from about 15% to about 25% of the third p-type doping concentration. In certain embodiments, the p-type doping concentrations of the first p-type GaN sublayer 232-1 and the second p-type GaN sublayer 232-2 are in a range of about $8\times10^{18}$ cm$^{-3}$ to about $2.5\times10^{19}$ cm$^{-3}$; and the p-type doping concentration of the third p-type GaN sublayer 232-3 is in a range of about $8\times10^{19}$ cm$^{-3}$ to about $2\times10^{20}$ cm$^{-3}$. In other embodiments, the p-type doping concentration of the p-type GaN layer 232 may sequentially increase across the plurality of p-type GaN sublayers 232-1 to 232-3 in a direction away from the active region 224. In this regard, a highest p-type doping concentration of the p-type GaN layer 232 is arranged farthest away from the active region 224 and closest to an area of the LED structure 220 where an external electrical connection is made. In certain embodiments, thicknesses of each of the p-type GaN sublayers 232-1 to 232-4 may vary. For example, the first p-type GaN sublayer 232-1 may have a thickness in a range of about 20 Å to about 40 Å, the second p-type GaN sublayer 232-2 may have a thickness in a range of about 700 Å to about 900 Å, and the third p-type GaN sublayer 232-3 may have a thickness in a range of about 225 Å to about 275 Å. In certain embodiments, the cap layer 226, the p-type In$_j$Ga$_{1-j}$N layer 228, the p-type Al$_k$In$_m$Ga$_{1-k-m}$N layer 230, and the p-type GaN layer 232 may be utilized in place of the cap layer 25, the p-type AlGaN layer 30, and the contact layer 32 of FIG. 1.

Figure 10A:
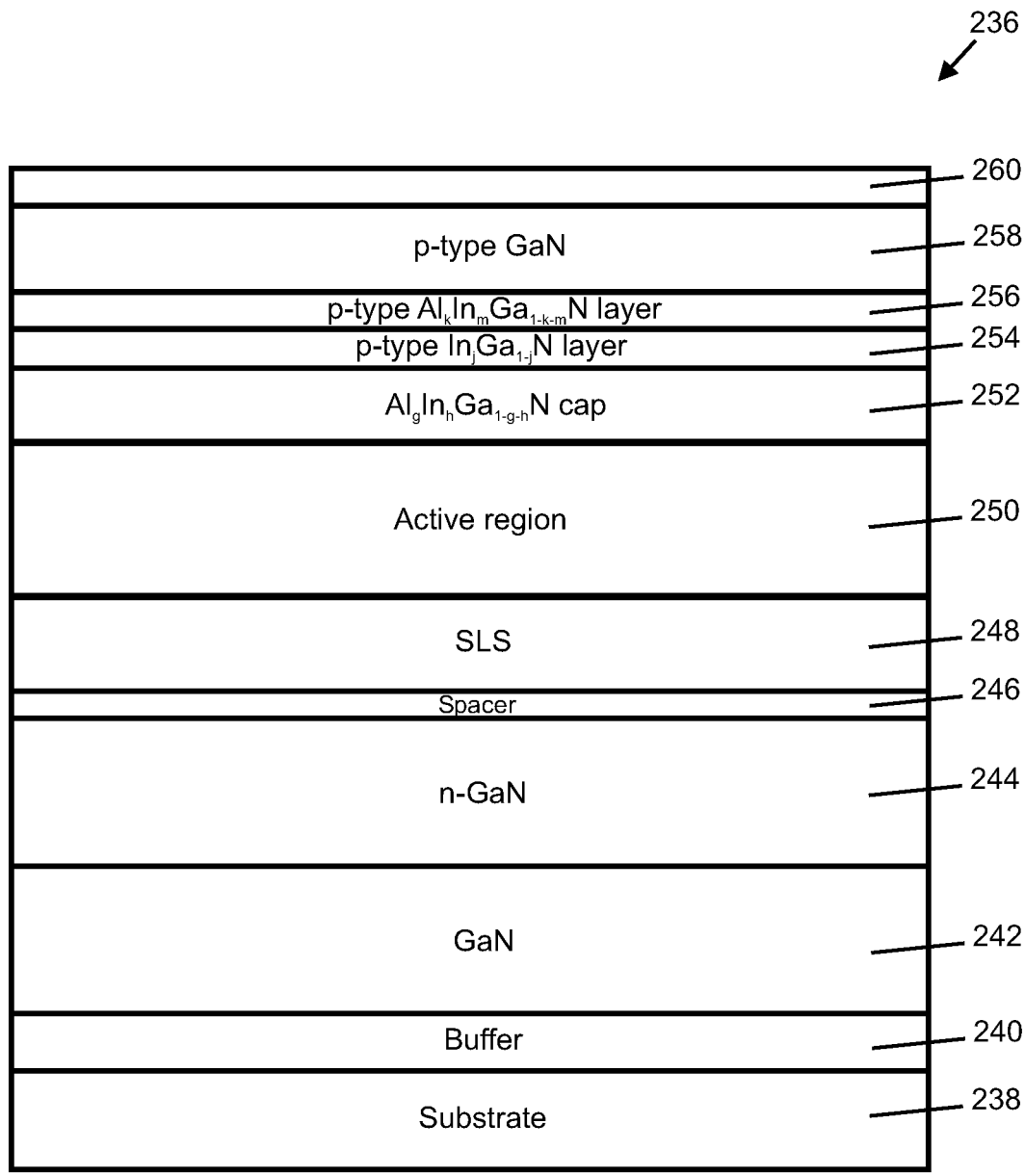
FIG. 10A is a representative cross-sectional schematic view of an LED structure according to embodiments disclosed herein that was used for various secondary ion mass spectrometry (SIMS) analysis measurements.

Secondary ion mass spectrometry (SIMS) analysis was performed for various LED structures according to embodiments disclosed herein. FIG. 10A is a representative cross-sectional schematic view of an LED structure 236 used for the various SIMS analysis measurements. The LED structure 236 includes a substrate 238, a nitride buffer layer 240, a first nitride layer 242, a second nitride layer 244, an optional spacer layer 246, a superlattice structure 248, an active region 250, a Al$_g$In$_h$Ga$_{1-g-h}$N cap layer 252, a p-type In$_j$Ga$_{1-j}$N layer 254, a p-type Al$_k$In$_m$Ga$_{1-k-m}$N layer 256, a p-type GaN layer 258, and a p-type InGaN contact layer 260 as previously described.

Figure 10B:
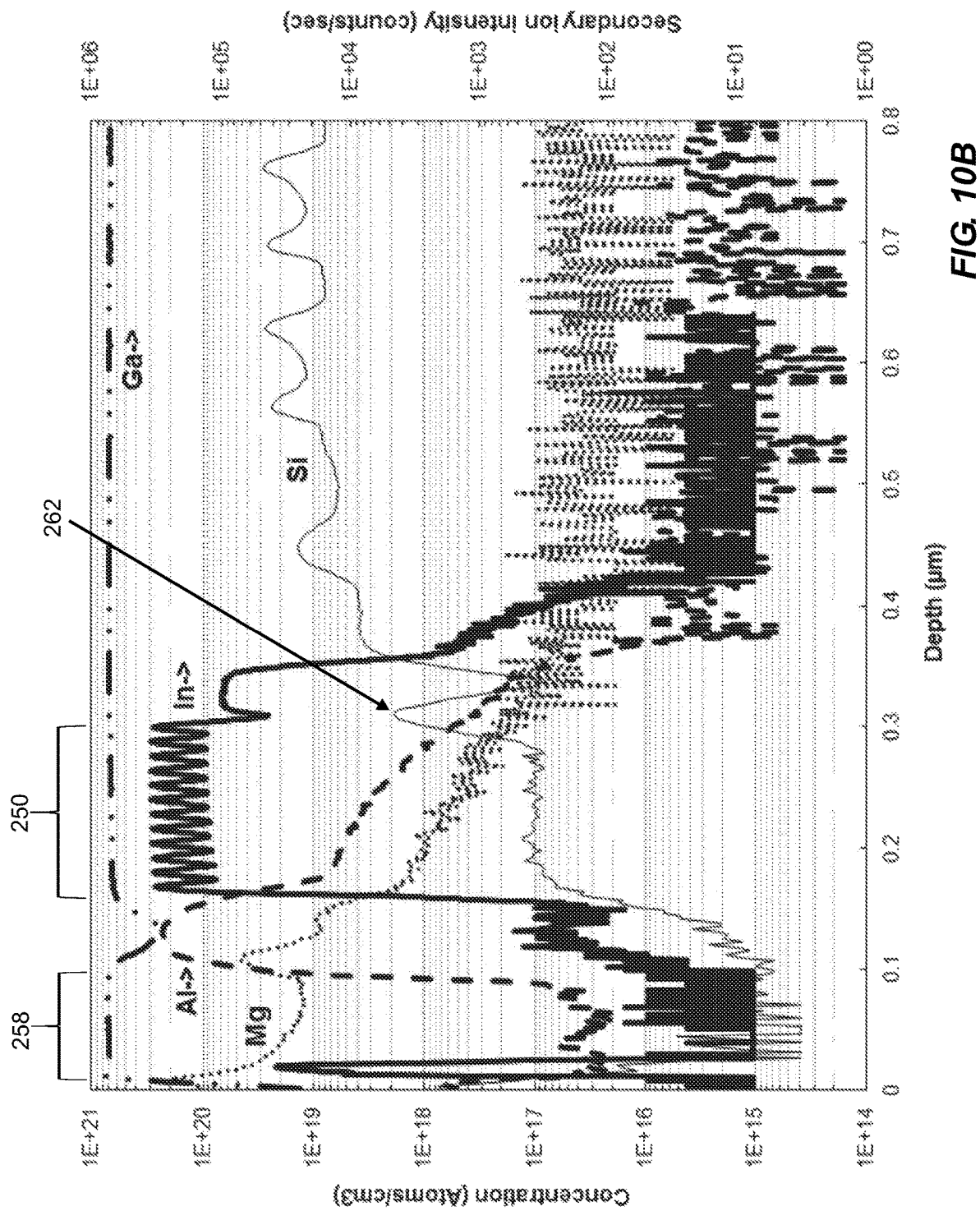
FIG. 10B is a SIMS analysis plot for the LED structure of FIG. 10A with the active region configured similar to the active region of FIG. 4; and the $Al_gIn_hGa_{1-g-h}N$ cap layer, the p-type $In_jGa_{1-j}N$ layer, the p-type $Al_kIn_mGa_{1-k-m}N$ layer, the p-type GaN layer, and the p-type InGaN contact layer being similar to the corresponding layers of FIG. 8.

FIG. 10B is a SIMS analysis plot for the LED structure 236 of FIG. 10A in which the active region 250 is similar to the active region 134 of FIG. 4, and the Al$_g$In$_h$Ga$_{1-g-h}$N cap layer 252, the p-type In$_j$Ga$_{1-j}$N layer 254, the p-type Al$_k$In$_m$Ga$_{1-k-m}$N layer 256, the p-type GaN layer 258, and the p-type InGaN contact layer 260 are similar to the corresponding layers of FIG. 8. The SIMS analysis provides elemental depth profiles for Group-III nitride materials and dopants. Depth is plotted in microns (μm) across the x-axis and a depth value of zero represents the top surface of the LED structure 236. Group-III nitride materials, including Al, In, and Ga, are plotted as relative secondary ion intensity in counts per second along the secondary y-axis, as indicated by the direction of arrows next to Al, In, and Ga in the plot. Dopants, including Mg and Si, are plotted by relative concentration in atoms per cubic centimeter (atoms/cm$^3$)

along the primary y-axis. In the SIMS plot of FIG. 10B, the active region 250 is generally located by the high In concentration. Notably, the Si profile includes a sharp peak 262 that corresponds to a first barrier layer with a higher n-type doping concentration (Si) than remaining barrier layers of the active region 250. Additionally, the Mg profile in the p-type GaN layer 258 is graded from a higher value closer to the surface of the LED structure 236 to a lower value in the portion of the p-type GaN layer 258 that is closer to the active region 250. It is noted that the brackets indicating the areas of the active region 250 and the p-GaN layer 258 are approximations only and are not intended to define exact boundaries.

Figure 10C:
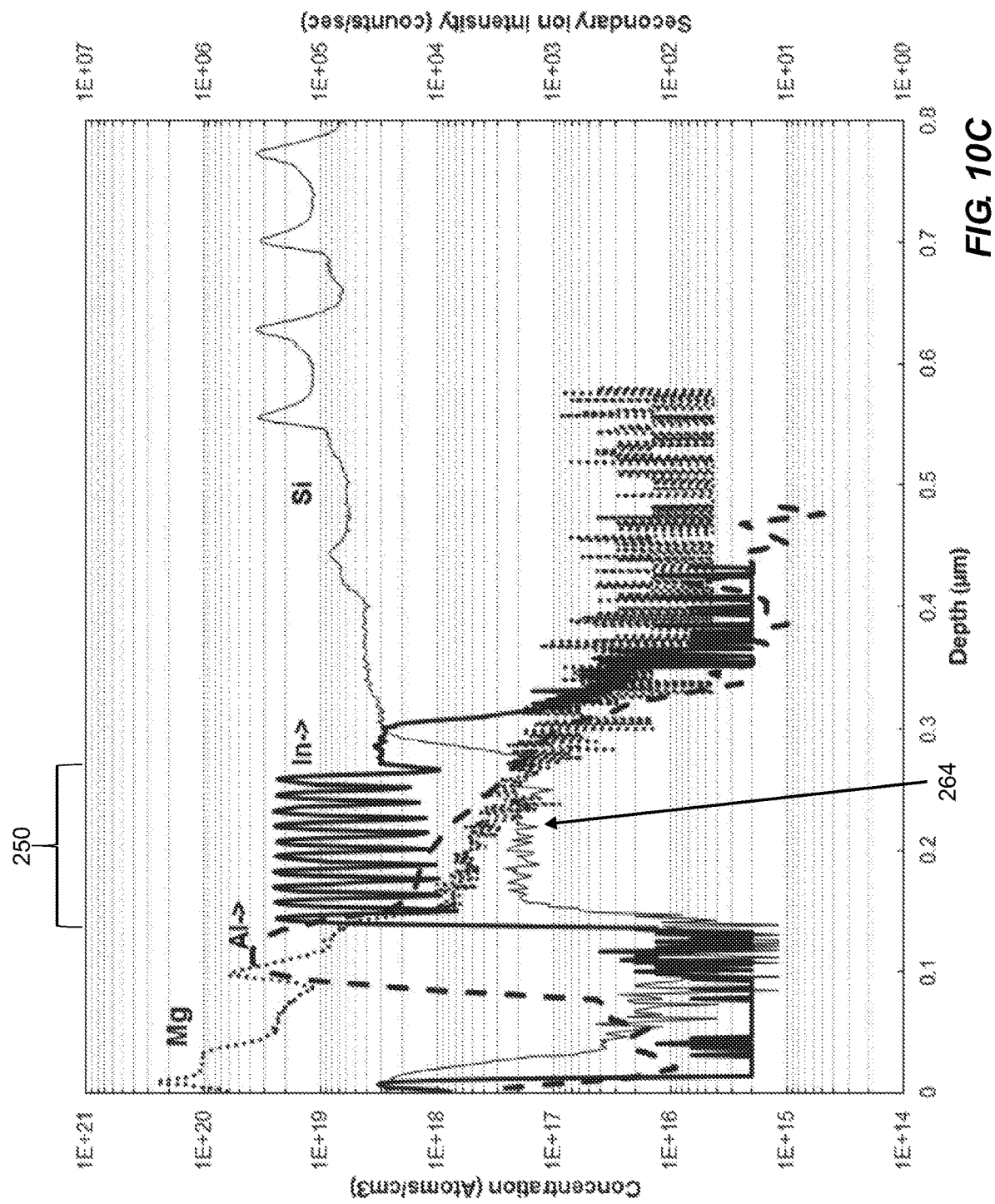
FIG. 10C is a SIMS analysis plot for the LED structure of FIG. 10A in which the active region is similar to the active region of FIG. 6; and the $Al_gIn_hGa_{1-g-h}N$ cap layer, the p-type $In_jGa_{1-j}N$ layer, the p-type $Al_kIn_mGa_{1-k-m}N$ layer, the p-type GaN layer, and the p-type InGaN contact layer being similar to the corresponding layers of FIG. 8.

FIG. 10C is a SIMS analysis plot for the LED structure 236 of FIG. 10A in which the active region 250 is similar to the active region 174 of FIG. 6, and the $Al_gIn_hGa_{1-g-h}N$ cap layer 252, the p-type $In_jGa_{1-j}N$ layer 254, the p-type $Al_kIn_mGa_{1-k-m}N$ layer 256, the p-type GaN layer 258, and the p-type InGaN contact layer 260 are similar to the corresponding layers of FIG. 8. In contrast to the SIMS analysis of FIG. 10B, the Si profile 264 in the active region 250 does not show a sharp peak, which is representative of a plurality of barrier layers doped with an n-type dopant in a similar manner. As previously described, the n-type doping within each barrier layer may be non-uniform.

Figure 10D:
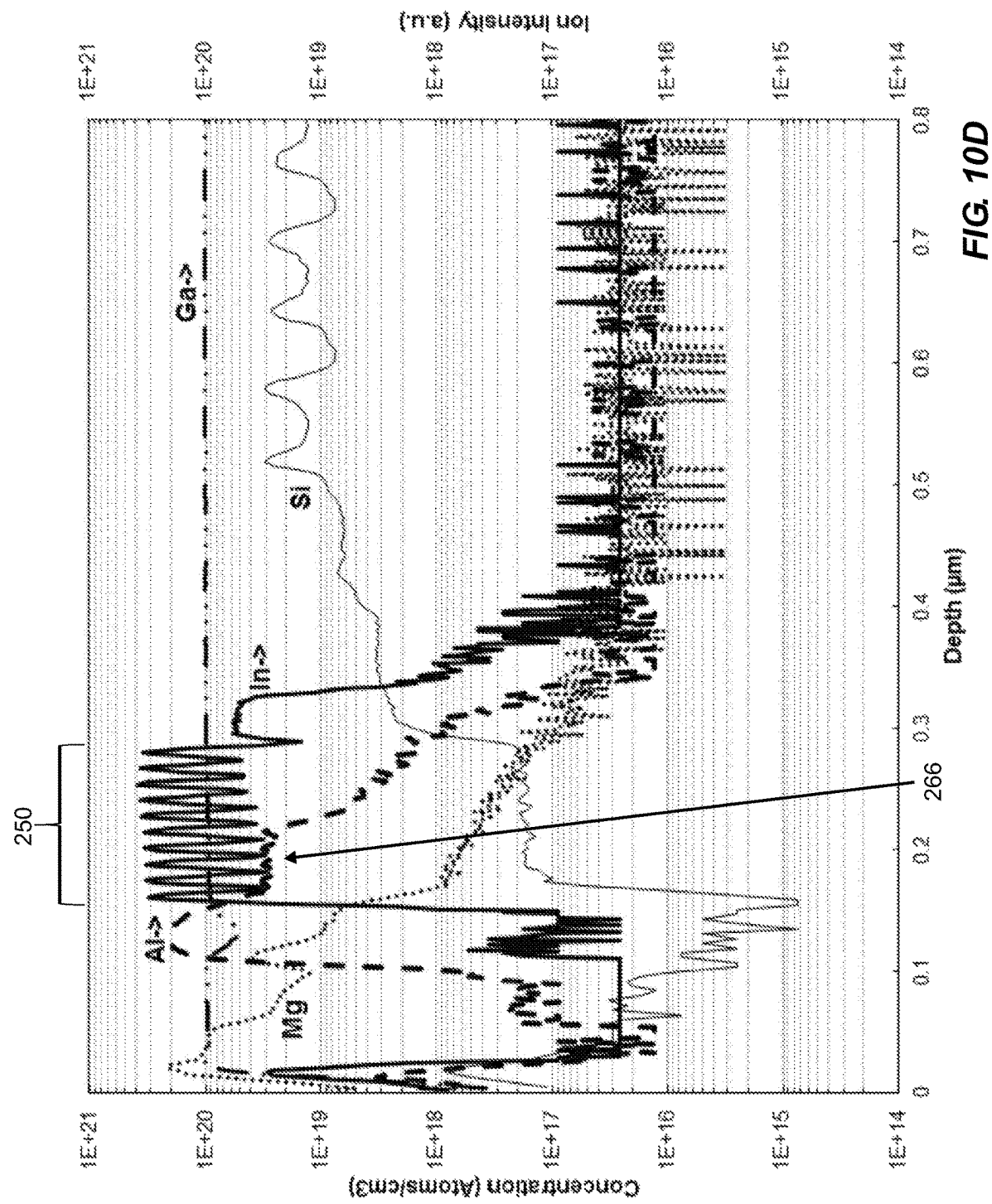
FIG. 10D is a SIMS analysis plot for the LED structure of FIG. 10A in which the active region is similar to the active region of FIG. 7; and the $Al_gIn_hGa_{1-g-h}N$ cap layer, the p-type $In_jGa_{1-j}N$ layer, the p-type $Al_kIn_mGa_{1-k-m}N$ layer, the p-type GaN layer, and the p-type InGaN contact layer being similar to the corresponding layers of FIG. 8.

FIG. 10D is a SIMS analysis plot for the LED structure 236 of FIG. 10A in which the active region 250 is similar to the active region 190 of FIG. 7, and the $Al_gIn_hGa_{1-g-h}N$ cap layer 252, the p-type $In_jGa_{1-j}N$ layer 254, the p-type $Al_kIn_mGa_{1-k-m}N$ layer 256, the p-type GaN layer 258, and the p-type InGaN contact layer 260 are similar to the corresponding layers of FIG. 8. In FIG. 10D, the secondary y-axis is plotted in arbitrary units. Notably, the Al profile in the active layer 250 show a higher value 266 in a portion of the active region 250 that is closer to the surface of the LED structure 236, which is representative of an Al-containing interface layer in at least one barrier-well unit, but fewer than all of the barrier-well units, of the active region 250.

FIG. 10E is a SIMS analysis plot for the LED structure 236 of FIG. 10A in which the active region 250 is similar to the active region 190 of FIG. 7; and the $Al_gIn_hGa_{1-g-h}N$ cap layer 252, the p-type $In_jGa_{1-j}N$ layer 254, the p-type $Al_kIn_mGa_{1-k-m}N$ layer 256, the p-type GaN layer 258, and the p-type InGaN contact layer 260 are similar to the corresponding layers of FIG. 9. In FIG. 10E, the secondary y-axis is plotted in arbitrary units. Notable, the Mg profile in the p-type GaN layer 258 is graded more smoothly from a higher value closer to the surface of the LED structure 236 to a lower value in the portion of the p-type GaN layer 258 that is closer to the active region 250. Additionally, there is an In peak 268 that represents the p-type $In_jGa_{1-j}N$ layer 254 for embodiments where j>0.

Performance data was collected for multiple LED chips with various structures according to embodiments disclosed herein. FIGS. 11A-11D represent comparison plots for forward voltage, forward voltage delta, brightness, and wavelength of various LED structures compared to a process of record (POR) structure. The various LED structures are listed as LED1, LED2, LED3, LED4, LED5, and LED6. The LED1 structure includes the active region 134 of FIG. 4 and the $Al_gIn_hGa_{1-g-h}N$ cap layer 212, the p-type $In_jGa_{1-j}N$ layer 214, the p-type $Al_kIn_mGa_{1-k-m}N$ layer 216, the p-type GaN layer 218, and the p-type InGaN contact layer 219 of FIG. 8. The LED2 structure includes the active region 134 of FIG. 4 and the $Al_gIn_hGa_{1-g-h}N$ cap layer 226, the p-type $In_jGa_{1-j}N$ layer 228, the p-type $Al_kIn_mGa_{1-k-m}N$ layer 230, the p-type GaN layer 232, and the p-type InGaN contact layer 234 of FIG. 9. The LED3 structure includes the active region 174 of FIG. 6 and the $Al_gIn_hGa_{1-g-h}N$ cap layer 212, the p-type $In_jGa_{1-j}N$ layer 214, the p-type $Al_kIn_mGa_{1-k-m}N$ layer 216, the p-type GaN layer 218, and the p-type InGaN contact layer 219 of FIG. 8. The LED4 structure includes the active region 174 of FIG. 6 and the $Al_gIn_hGa_{1-g-h}N$ cap layer 226, the p-type $In_jGa_{1-j}N$ layer 228, the p-type $Al_kIn_mGa_{1-k-m}N$ layer 230, the p-type GaN layer 232, and the p-type InGaN contact layer 234 of FIG. 9. The LED5 structure includes the active region 190 of FIG. 7 and the $Al_gIn_hGa_{1-g-h}N$ cap layer 212, the p-type $In_jGa_{1-j}N$ layer 214, the p-type $Al_kIn_mGa_{1-k-m}N$ layer 216, the p-type GaN layer 218, and the p-type InGaN contact layer 219 of FIG. 8. The LED6 structure includes the active region 190 of FIG. 7 and the $Al_gIn_hGa_{1-g-h}N$ cap layer 226, the p-type $In_jGa_{1-j}N$ layer 228, the p-type $Al_kIn_mGa_{1-k-m}N$ layer 230, the p-type GaN layer 232, and the p-type InGaN contact layer 234 of FIG. 9. The POR structure includes a LED structure without the enhancements embodied in the LED1 to LED6 structures, to provide a basis for comparing performance of the LED1 to LED6 structures.

Figure 11A:
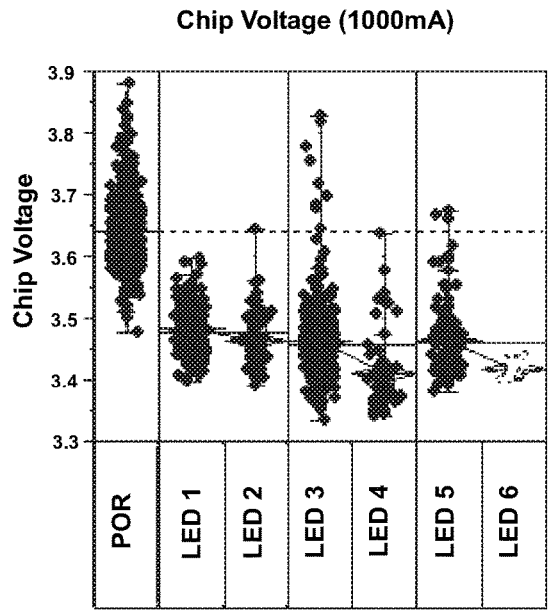
FIG. 11A represents a comparison plot for forward voltage of various LED structures according to embodiments disclosed herein compared to a process of record (POR) structure.
Figure 11B:
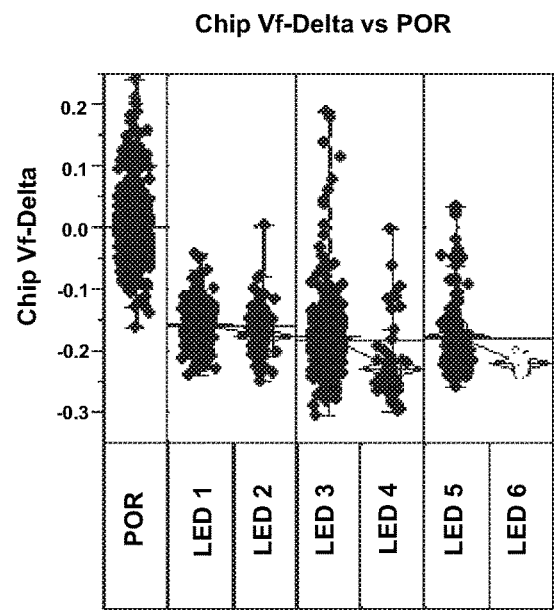
FIG. 11B represents a comparison plot for the forward voltage delta of various LED structures according to embodiments disclosed herein compared to a POR structure.
Figure 11C:
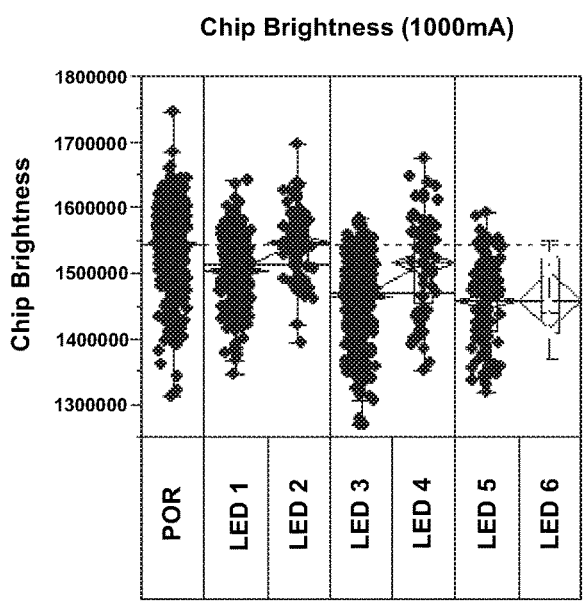
FIG. 11C represents a comparison plot for the relative brightness of various LED structures according to embodiments disclosed herein compared to a POR structure.
Figure 11D:
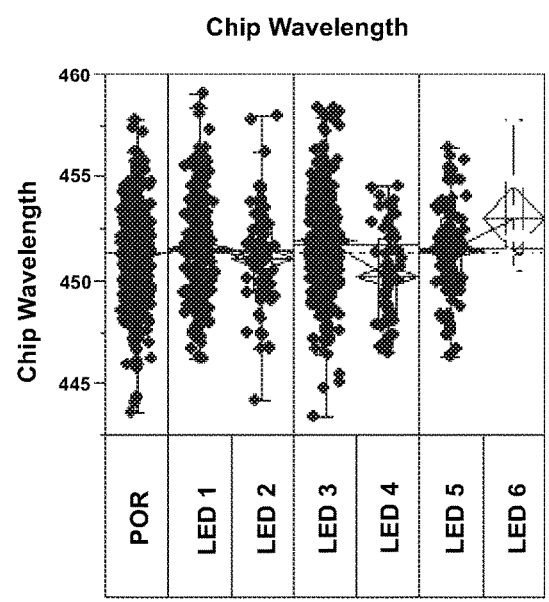
FIG. 11D represents a comparison plot for the wavelength of various LED structures according to embodiments disclosed herein compared to a POR structure.

FIG. 11A represents a comparison plot for forward voltage of the LED1 to LED6 structures compared to the POR structure. FIG. 11B represents a comparison plot for the forward voltage delta to the POR for the LED1 to LED6 structures. Notably, every LED structure (LED1 to LED6) beneficially exhibits substantially lower forward voltage, or turn-on voltage, relative to the POR structure. FIG. 11C represents a comparison plot for the relative brightness of each of the LED1 to LED6 structures compared to the POR structure. Although average brightness values for the LED1 to LED6 structures are slightly lower than for the POR structure, FIG. 11C shows substantial overlap between chip brightness ranges of LED1 to LED6 samples relative to samples of the POR structure, showing that similar brightness can be provided in combination with lower turn-on voltage (as shown in FIGS. 11A-11B). FIG. 11D represents a comparison plot for the wavelength of each of the LED1 to LED6 structures compared to the POR structure. As shown, for similar wavelength values, the brightness can be similar for some LED structures and slightly lower for others. Accordingly, different ones of the LED1 to LED6 structures may be suitable for different applications.

Figure 12A:
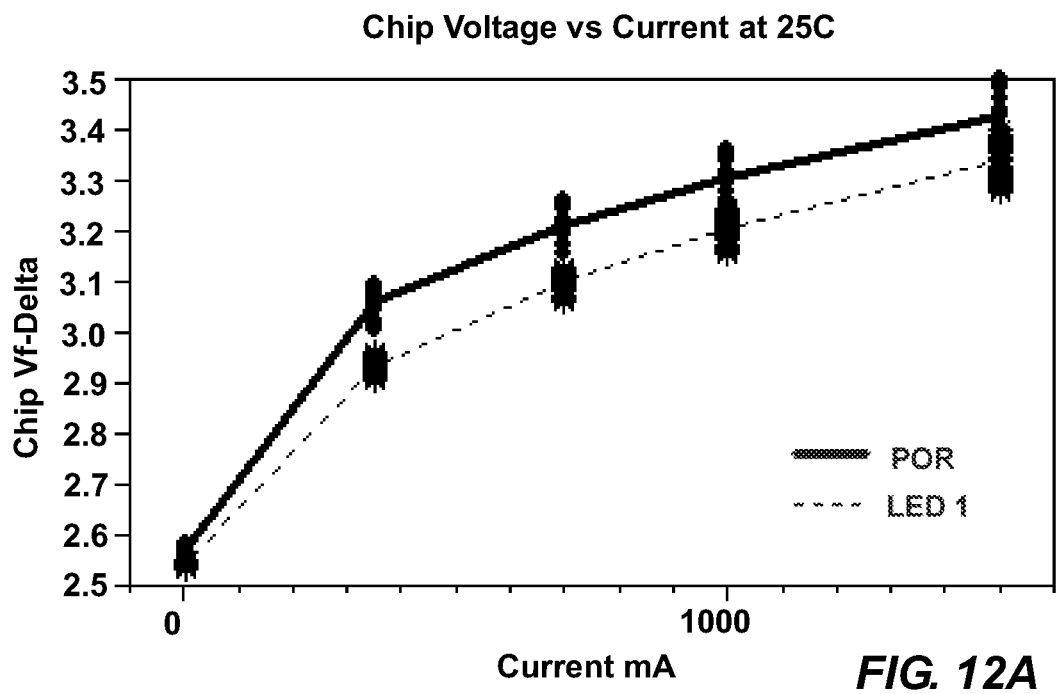
FIG. 12A represents a plot of the forward voltage performance with increasing current of various LED structures according to embodiments disclosed herein compared to a POR structure.
Figure 12B:
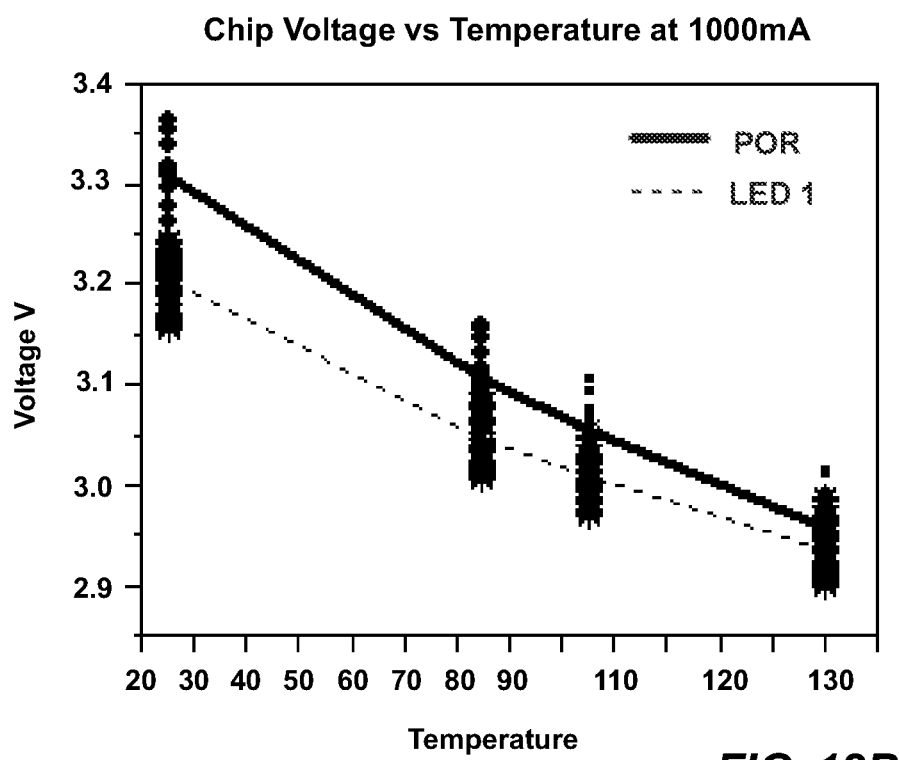
FIG. 12B represents a plot of the forward voltage performance with increasing operating temperature of various LED structures according to embodiments disclosed herein compared to a POR structure.

FIG. 12A represents a plot of forward voltage performance with increasing current for the LED1 structure and the POR structure. The forward voltage at different drive currents between 0 and 1500 mA was measured for the LED1 structure and the POR structure. As shown in the plot, the forward voltage of the POR structure is consistently higher than the forward voltage of the LED1 structure for all currents above 0. In this regard, the LED1 structure may be driven with higher currents to increase brightness while maintaining acceptable forward voltage values. FIG. 12B represents a plot of forward voltage performance with increasing operating temperatures. As shown in the plot, with increasing operating temperatures, the forward voltage decreases for each of the POR and the LED1 structures. However, the LED1 structure again demonstrates a consistently lower forward voltage value.

Beneficial technical effects that may be provided by embodiments disclosed herein include one or more of the following: providing LEDs with higher efficiency; providing LEDs with reduced forward voltage (e.g., over a wide range of electrical current values and/or over a wide range of operating temperatures); wherein one or more of the foregoing features may be obtained in combination without detrimental increases in current droop and/or thermal droop.

Those skilled in the art will recognize improvements and modifications to the preferred embodiments of the present disclosure. All such improvements and modifications are considered within the scope of the concepts disclosed herein and the claims that follow.

What is claimed is:

1. A light emitting diode (LED), comprising:
   an n-type GaN layer;
   a superlattice structure;
   a spacer layer arranged between the superlattice structure and the n-type GaN layer, the spacer layer comprising a first sublayer that is in direct contact with the superlattice structure and a second sublayer that is in direct contact with the n-type GaN layer, and the first sublayer has a higher n-type doping concentration than the second sublayer to provide a single step doping profile for the entire spacer layer; and
   an active region on the superlattice structure such that the superlattice structure is arranged between the active region and the spacer layer, the active region comprising a plurality of sequentially arranged barrier-well units, wherein each barrier-well unit comprises an $Al_aIn_bGa_{1-a-b}N$ barrier layer and an $In_cGa_{1-c}N$ well layer;
   wherein the plurality of sequentially arranged barrier-well units comprises a first barrier-well unit and a plurality of second barrier-well units; and
   wherein an $Al_aIn_bGa_{1-a-b}N$ barrier layer of the first barrier-well unit comprises a higher n-type doping concentration than an n-type doping concentration of each $Al_aIn_bGa_{1-a-b}N$ barrier layer of the plurality of second barrier-well units.

2. The LED of claim 1, wherein in the $Al_aIn_bGa_{1-a-b}N$ barrier layer, $0 \leq a \leq 0.50$ and $0 \leq b \leq 0.10$, and in the $In_cGa_{1-c}N$ well layer, $c > 0.05$ and $c > 2 \cdot b$.

3. The LED of claim 1, wherein the first barrier-well unit is arranged between the n-type GaN layer and the plurality of second barrier-well units.

4. The LED of claim 1, wherein the first sublayer is arranged between the second sublayer and the n-type GaN layer.

5. The LED of claim 1, wherein the superlattice structure is arranged between the spacer layer and the first barrier-well unit.

6. The LED of claim 1, wherein the $Al_aIn_bGa_{1-a-b}N$ barrier layer of the first barrier-well unit comprises an n-type doping concentration that is at least two times higher than an n-type doping concentration of each $Al_aIn_bGa_{1-a-b}N$ barrier layer of the plurality of second barrier-well units.

7. The LED of claim 1, wherein the $Al_aIn_bGa_{1-a-b}N$ barrier layer of the first barrier-well unit comprises an n-type doping concentration that is at least five times higher than an n-type doping concentration of each $Al_aIn_bGa_{1-a-b}N$ barrier layer of the plurality of second barrier-well units.

8. The LED of claim 1, wherein the $Al_aIn_bGa_{1-a-b}N$ barrier layer of the first barrier-well unit comprises an n-type doping concentration within a range of from (i) at least two times higher than an n-type doping concentration of each $Al_aIn_bGa_{1-a-b}N$ barrier layer of the plurality of second barrier-well units to (ii) no more than ten times higher than an n-type doping concentration of each $Al_aIn_bGa_{1-a-b}N$ barrier layer of the plurality of second barrier-well units.

9. The LED of claim 1, further comprising:
   an $Al_gIn_hGa_{1-g-h}N$ cap layer, wherein $0 < g < 1$, $0 \leq h < 1$, and $g + h < 1$;
   a p-type $In_jGa_{1-j}N$ layer, wherein $0 \leq j < 1$; and
   a p-type $Al_kIn_mGa_{1-k-m}N$ layer, wherein $0 < k < 1$, $0 \leq m < 1$, and $k + m < 1$;
   wherein the $Al_gIn_hGa_{1-g-h}N$ cap layer is arranged between the active region and the p-type $In_jGa_{1-j}N$ layer; and
   wherein the p-type $In_jGa_{1-j}N$ layer is arranged between the $Al_gIn_hGa_{1-g-h}N$ cap layer and the p-type $Al_kIn_mGa_{1-k-m}N$ layer.

10. The LED of claim 9, further comprising a p-type GaN layer, wherein the p-type $Al_kIn_mGa_{1-k-m}N$ layer is arranged between the p-type $In_jGa_{1-j}N$ layer and the p-type GaN layer.

11. The LED of claim 10, wherein the p-type GaN layer comprises:
   a first p-type GaN sublayer with a first p-type doping concentration;
   a second p-type GaN sublayer with a second p-type doping concentration;
   a third p-type GaN sublayer with a third p-type doping concentration; and
   a fourth p-type GaN sublayer with a fourth p-type doping concentration;
   wherein the fourth p-type doping concentration is about equal to the second p-type doping concentration;
   wherein the first p-type doping concentration is in a range of from about 1% to about 20% of the fourth p-type doping concentration; and
   wherein the third p-type doping concentration is in a range of from about 25% to about 75% of the fourth p-type doping concentration.

12. The LED of claim 10, wherein the p-type GaN layer comprises:
   a first p-type GaN sublayer with a first p-type doping concentration;
   a second p-type GaN sublayer with a second p-type doping concentration; and
   a third p-type GaN sublayer with a third p-type doping concentration;
   wherein the first p-type doping concentration and the second p-type doping concentration are in a range of from about 5% to about 35% of the third p-type doping concentration.

13. The LED of claim 12, wherein in the p-type $In_jGa_{1-j}N$ layer, $j > 0$.

14. The LED of claim 1, wherein at least one barrier-well unit, but fewer than all barrier-well units, of the plurality of sequentially arranged barrier-well units additionally comprises an $Al_eIn_fGa_{1-e-f}N$ interface layer, wherein $e > 0$, and wherein $e \geq f$.

15. The LED of claim 1, wherein at least one $Al_aIn_bGa_{1-a-b}N$ barrier layer of the plurality of sequentially arranged barrier-well units comprises a lower boundary, an upper boundary, and an n-type doping concentration that is non-uniform between the upper boundary and the lower boundary, with a maximum n-type doping concentration located between the upper boundary and the lower boundary.

16. The LED of claim 15, wherein:
   the at least one $Al_aIn_bGa_{1-a-b}N$ barrier layer of the plurality of sequentially arranged barrier-well units comprises a thickness extending between the lower boundary and the upper boundary;
   the thickness is divisible into a lower third proximate to the lower boundary, an upper third proximate to the upper boundary, and a middle third arranged between the lower third and the upper third; and the maximum n-type doping concentration is located within the middle third.

* * * * *

UNITED STATES PATENT AND TRADEMARK OFFICE
CERTIFICATE OF CORRECTION

PATENT NO. : 11,393,948 B2  
APPLICATION NO. : 16/118788  
DATED : July 19, 2022  
INVENTOR(S) : Joseph G. Sokol et al.

Page 1 of 1

It is certified that error appears in the above-identified patent and that said Letters Patent is hereby corrected as shown below:

In the Specification

Column 2, Lines 52 and 61, replace "$In_bGa_{1-b}N$ well layer" with --$In_cGa_{1-c}N$ well layer--.
Column 16, Line 22, replace "barrier-well units 122A, 122B" with --barrier-well units 122A, 122B--.
Column 17, Line 66, replace "wherein d>0 and d e" with --wherein d>0 and d>e--.
Column 22, Line 9, replace "a discreet discrete layer" with --a discrete layer--.
Column 23, Line 39, replace "(wherein d>0 and wherein d e)" with --(wherein d>0 and wherein d>e)--.

Signed and Sealed this  
Fourth Day of October, 2022

Katherine Kelly Vidal  
*Director of the United States Patent and Trademark Office*